United States Patent
Wei

(10) Patent No.: US 12,489,057 B2
(45) Date of Patent: Dec. 2, 2025

(54) GATE TIE STRUCTURES TO BURIED OR BACKSIDE POWER RAILS

(71) Applicant: Intel Corporation, Santa Clara, CA (US)

(72) Inventor: Andy Chih-Hung Wei, Yamhill, OR (US)

(73) Assignee: Intel Corporation, Santa Clara, CA (US)

( * ) Notice: Subject to any disclaimer, the term of this patent is extended or adjusted under 35 U.S.C. 154(b) by 951 days.

(21) Appl. No.: 17/446,206

(22) Filed: Aug. 27, 2021

(65) Prior Publication Data
US 2023/0067354 A1   Mar. 2, 2023

(51) Int. Cl.
| | | |
|---|---|---|
| H01L 23/528 | (2006.01) | |
| H01L 21/02 | (2006.01) | |
| H10D 30/01 | (2025.01) | |
| H10D 30/67 | (2025.01) | |
| H10D 62/10 | (2025.01) | |
| H10D 84/01 | (2025.01) | |
| H10D 84/03 | (2025.01) | |
| H10D 84/85 | (2025.01) | |

(52) U.S. Cl.
CPC ...... *H01L 23/5286* (2013.01); *H01L 21/0259* (2013.01); *H10D 30/031* (2025.01); *H10D 30/6735* (2025.01); *H10D 30/6757* (2025.01); *H10D 62/118* (2025.01); *H10D 84/0167* (2025.01); *H10D 84/0186* (2025.01); *H10D 84/038* (2025.01); *H10D 84/85* (2025.01)

(58) Field of Classification Search
CPC ............ H01L 23/5286; H01L 21/0259; H10D 62/118; H10D 30/6735; H10D 30/6757; H10D 84/0186; H10D 84/85; H10D 84/0167; H10D 30/031; H10D 84/038
See application file for complete search history.

(56) References Cited

U.S. PATENT DOCUMENTS

| 10,756,174 B2 * | 8/2020 | Van Dal ............ H01L 29/42392 |
| 2014/0151639 A1 * | 6/2014 | Chang ................. H01L 29/0673 |
| | | 257/27 |

(Continued)

OTHER PUBLICATIONS

Extended European Search Report received for EP application No. 22182774.4, dated Dec. 5, 2022. 10 pages.

*Primary Examiner* — Norman D Richards
*Assistant Examiner* — Sean Ayers Winters
(74) *Attorney, Agent, or Firm* — Finch & Maloney PLLC

(57) ABSTRACT

Techniques are provided herein to form semiconductor devices having gate tie-down structures between the device gate and a buried/backside power rail (BPR). In an example, a semiconductor device includes a conductive material that is part of a transistor gate structure on a semiconductor region. The semiconductor region can be, for example, a fin or a set of one or more nanowires or nanoribbons that extends between a source region and a drain region. A BPR structure is beneath a dielectric layer that is between the BPR structure and the conductive material of the gate structure. A portion of the conductive material also extends through the dielectric material to provide a conductive via between the gate structure and the underlying BPR structure. The conductive material may be, for example, work function and/or metal fill material of the gate electrode of the gate structure.

20 Claims, 11 Drawing Sheets

(56) References Cited

U.S. PATENT DOCUMENTS

| | | | |
|---|---|---|---|
| 2016/0190339 A1* | 6/2016 | Xie | H01L 29/41783 |
| | | | 257/347 |
| 2018/0248041 A1 | 8/2018 | Hook et al. | |
| 2019/0157310 A1 | 5/2019 | Glass et al. | |
| 2020/0035560 A1* | 1/2020 | Block | H01L 29/0657 |
| 2020/0219970 A1* | 7/2020 | Mannebach | H01L 29/66439 |
| 2020/0303502 A1* | 9/2020 | Bomberger | H01L 29/78696 |
| 2021/0193836 A1* | 6/2021 | Guha | H01L 29/775 |
| 2021/0242322 A1* | 8/2021 | Liang | H01L 29/785 |

* cited by examiner

GATE TIE STRUCTURES TO BURIED OR BACKSIDE POWER RAILS

FIELD OF THE DISCLOSURE

The present disclosure relates to integrated circuits, and more particularly, to transistor gate connections to buried or backside power rails.

BACKGROUND

As integrated circuits continue to scale downward in size, a number of challenges arise. For instance, reducing the size of memory and logic cells is becoming increasingly more difficult. One possible solution that can be used to allow further scaling of cell size includes buried or backside power rail technology, or more generally BPR technology. In some cases, BPR technology includes burying of conductors that deliver power (sometimes called power rails) to cells below the back end of line (BEOL) metal layers, usually in the same level as the device layer that includes semiconductor fins. In other cases, BPR technology includes forming such power rails on the backside of the substrate underneath the device layer. Such BPR configurations free-up overhead to make more room for logic connections and enable further scaling of a standard logic cell (e.g., memory and logic cells). BPR configurations also allow for relatively larger power rails (e.g., thicker), which in turn exhibit lower resistance and power dissipation. However, there remain a number of non-trivial challenges with respect to forming connections to such BPR structures.

Figure 1A:
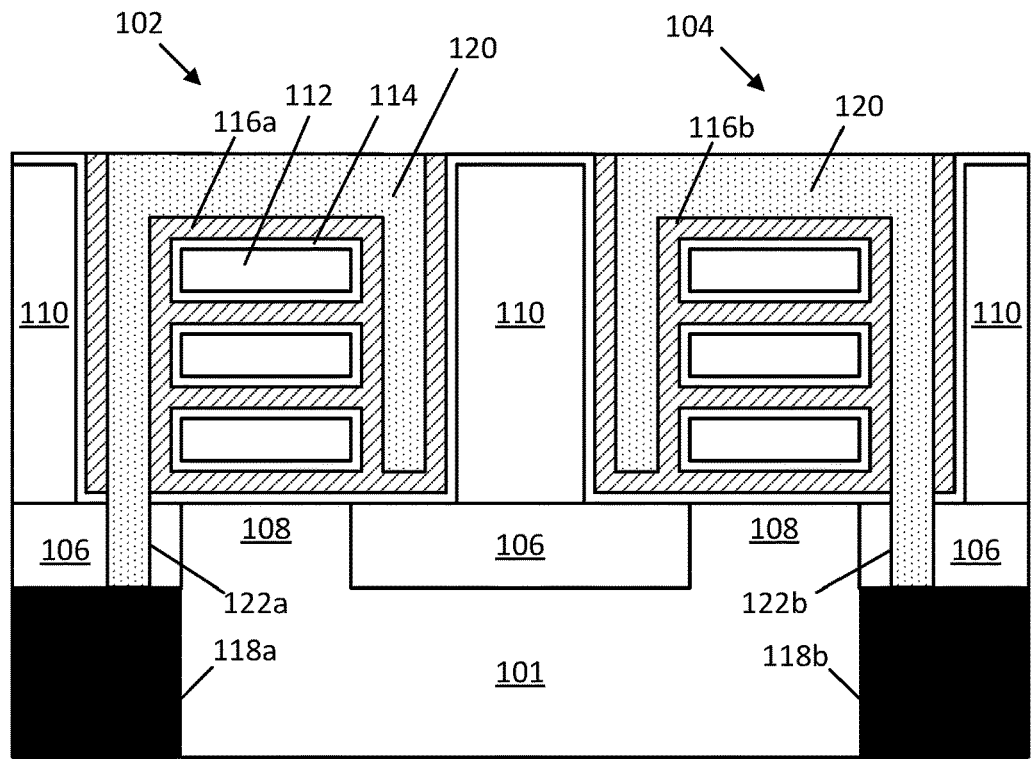
FIGS. 1A and 1B are cross-sectional and plan views of some semiconductor devices that illustrate gate tie structures to buried or backside power (BPR) rails, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Techniques are provided herein to form semiconductor devices having gate tie structures between the device gate and a buried or backside power rail (BPR). The techniques can be used in any number of integrated circuit applications and are particularly useful with respect to logic and memory cells, such as those cells that use finFETs or gate-all-around (GAA) transistors. In an example, a semiconductor device includes a conductive material that is part of a transistor gate structure around or otherwise on a semiconductor region. The semiconductor region can be, for example, a fin of semiconductor material that extends between a source region and a drain region, or one or more nanowires or nanoribbons of semiconductor material that extend between a source region and a drain region. The gate structure includes a gate dielectric (e.g., high-k gate dielectric material) and a gate electrode (e.g., conductive material such as work function material and/or gate fill metal). A BPR structure is beneath a dielectric layer that is between the BPR structure and the conductive material of the gate structure. According to some such embodiments, the conductive material of the gate structure also extends through the dielectric material and contacts the BPR structure. In this manner, the portion of the conductive material that extends through the dielectric material effectively provides a via between the gate structure and the underlying BPR structure. Accordingly, the transistor gate of the semiconductor device can be biased with the power rail voltage supplied by the BPR structure. Note that the via may be self-aligned given the selective nature of the etch process that creates the hole or trench that passes through the dielectric material. Further note the continuous nature of the conductive material, according to some embodiments, in which there is no seam between the gate portion of the conductive material and the via portion of the conductive material (e.g., one continuous body of tungsten or other metal). In some embodiments, the gate electrode includes a work function layer that is on the underlying gate dielectric, and further includes a metal fill layer on the work function layer, wherein the metal fill layer also provides the via to the underlying BPR structure. Numerous variations and embodiments will be apparent in light of this disclosure.

General Overview

In many integrated circuit layouts, one or more of the transistors that are formed at the edges of cell boundaries are dummy devices (also known as gate-tied down devices) that have the same structure as the other transistors used within the cell, but have their gates tied to either power rails (e.g., VDD or VSS) or ground. Accordingly, such dummy devices are biased to provide isolation between different standard cells in the integrated circuit layout. For example, n-channel devices may have their gates tied to VSS to be biased off while p-channel devices may have their gates tied to VDD to be biased off. In situations where the power rails (e.g., VDD and VSS) are provided in the interconnect layers above the substrate, top-side contacts are used to connect the transistor gates to the corresponding power rails. However, this is not possible when the power rails are buried below the surface of the substrate, or provisioned on the backside of the substrate (e.g., both generally referred to herein as BPR structures).

Thus, and in accordance with an embodiment of the present disclosure, techniques are provided herein to form transistor gate connections to BPR structures. In some cases, the techniques can be used to form self-aligned contact structures between the gates of dummy devices and BPR structures. In one example, neighboring n-channel and p-channel semiconductor devices may have their gates tied down to separate underlying BPR structures to supply VSS and VDD power, respectively, to the gates of the n-channel and p-channel semiconductor devices. According to some embodiments, via openings may be etched through an underlying dielectric layer to expose the BPR structures and the via opening etch may be self-aligned based on the position of a conductive layer earlier-deposited over the semiconductor regions of the semiconductor devices. In some embodiments, the conductive layer is part of the gate structure and acts as a work function metal around the semiconductor regions. Such work function metal can be deposited, for instance, on a high-k gate dielectric, in some embodiments. Once the via openings have been formed, a fill metal is deposited on the conductive layer and within the via openings to contact the underlying BPR structures and provide electrical coupling between the gate of a given semiconductor device and the corresponding BPR structure. In this manner, the fill metal not only provides part of the gate electrode but also provides a via from the gate electrode to the underlying BPR, such that the fill metal of the gate electrode and the via is a continuous body of metal. Once the via opening has been filled with a conductive material (e.g., with a fill metal) it may be referred to herein as a conductive via.

According to an embodiment, an integrated circuit includes a substrate, a dielectric layer on the substrate, a semiconductor device having at least a portion extending above a top surface of the dielectric layer and having a semiconductor region extending between a source region and a drain region, a buried conductive layer below the top surface of the dielectric layer within the substrate, a conductive material around the semiconductor region, and a via opening through the dielectric layer. The conductive material is also in the via opening to form a conductive via that contacts the buried conductive layer.

According to an embodiment, an electronic device includes a chip package having one or more dies. At least one of the one or more dies includes a dielectric layer, a semiconductor device having at least a portion extending above a top surface of the dielectric layer and having a semiconductor region extending between a source region and a drain region, a buried conductive layer below the top surface of the dielectric layer, a conductive material around the semiconductor region, and a via opening through the dielectric layer. The conductive material is also in the via opening to form a conductive via that contacts the buried conductive layer.

According to another embodiment, a method of forming an integrated circuit includes forming a fin structure extending above a substrate, the fin structure comprising semiconductor material; forming a buried conductive layer adjacent to the fin structure and within the substrate, or below the substrate; forming a dielectric layer above the buried conductive layer, at least a portion of the fin structure extending above a top surface of the dielectric layer; forming a via opening through the dielectric layer to expose the buried conductive layer, the via opening adjacent to the fin structure; and forming a conductive material around the semiconductor material and in the via opening, such that the conductive material contacts the buried conductive layer.

The techniques can be used with any type of planar and non-planar transistors, including finFETs (sometimes called double-gate transistors, or tri-gate transistors), or nanowire and nanoribbon transistors (sometimes called gate-all-around transistors), to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of a conductive via extending between the gate structure on the semiconductor region of a transistor and a BPR structure, wherein a portion of the gate electrode and the conductive via are a continuous body of metal (e.g., a body of tungsten or cobalt or ruthenium or an alloy). The BPR structure may be on an opposite side of the transistor from other interconnect layers that provide logic signals between the active transistors of the integrated circuit. In some embodiments, the conductive vias are observed on dummy devices located along one or more edges of a standard cell layout. Numerous configurations and variations will be apparent in light of this disclosure.

As used herein, the term "backside" generally refers to the area beneath one or more semiconductor devices (below the device layer) either within the device substrate or in the region of the device substrate (in the case where the bulk of the device substrate has been removed). Note that the backside may become a frontside, and vice-versa, if a given structure is flipped. To this end, and as will be appreciated, the use of terms like "above" "below" "beneath" "upper" "lower" "top" and "bottom" are used to facilitate discussion and are not intended to implicate a rigid structure or fixed orientation; rather such terms merely indicate spatial relationships when the structure is in a given orientation.

Architecture

Figure 1B:
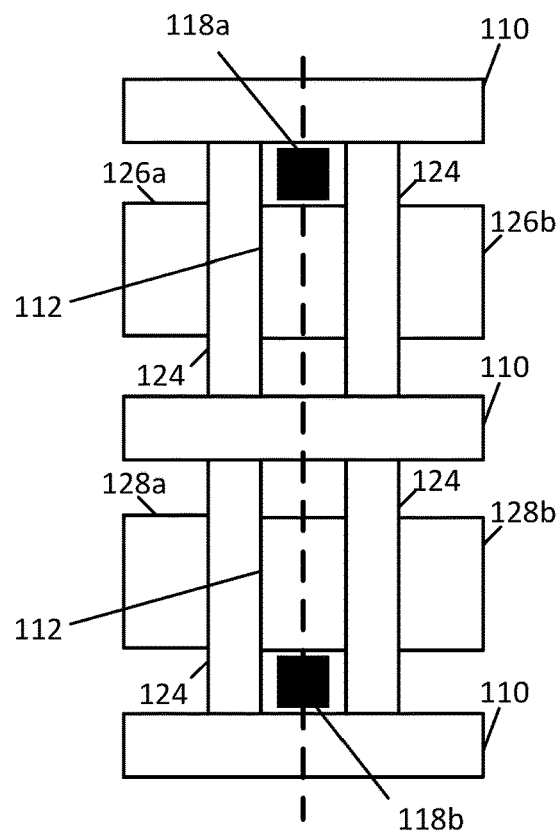

FIG. 1A is a cross sectional view taken across two example semiconductor devices 102 and 104, according to an embodiment of the present disclosure. FIG. 1B is a top-down view of the adjacent semiconductor devices 102 and 104 where FIG. 1A illustrates the cross section taken across the dotted line. It should be noted that some of the material layers (such as conductive layers 116a and 116b, and metal fill 120) in the top-down view of FIG. 1B have been omitted for clarity. Each of semiconductor devices 102 and 104 may be non-planar metal oxide semiconductor (MOS) transistors, such as tri-gate or gate-all-around (GAA) transistors, although other transistor topologies and types could also benefit from the techniques provided herein. The illustrated embodiments herein use the GAA structure. Semiconductor devices 102 and 104 represent a portion of an integrated circuit that may contain any number of similar semiconductor devices. In some embodiments, semiconductor devices 102 and 104 represent dummy devices that are present along a standard cell boundary and are biased in a permanent off state.

As can be seen, semiconductor devices 102 and 104 are formed on a substrate 101. Any number of semiconductor devices can be formed on substrate 101, but two are used here as an example. Substrate 101 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 101 can be a semiconductor-on-insulator substrate having a desired semiconductor layer over a buried insulator layer (e.g., silicon over silicon dioxide). Alternatively, substrate 101 can be a multilayer substrate or superlattice suitable for forming nanowires or nanoribbons (e.g., alternating layers of silicon and SiGe, or alternating layers indium gallium arsenide and indium phosphide). Any number of substrates can be used.

The semiconductor material in each of semiconductor devices 102 and 104 may be formed from substrate 101. Semiconductor devices 102 and 104 may each include fins or semiconductor material as nanowires or nanoribbons that can be, for example, native to substrate 101 (formed from the substrate itself). Alternatively, the fins or semiconductor material can be formed of material deposited onto an underlying substrate. In one such example case, a blanket layer of silicon germanium (SiGe) can be deposited onto a silicon substrate, and then patterned and etched to form a plurality of SiGe fins or nanoribbons. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. Again, the alternating layers can be blanket deposited and then etched into fins, or deposited into fin-shaped trenches.

As can further be seen, adjacent semiconductor devices are separated by a dielectric layer 106 that may include silicon oxide. Dielectric layer 106 provides shallow trench isolation (STI) between any adjacent semiconductor devices. Dielectric layer 106 can be any suitable dielectric material, such as silicon dioxide, aluminum oxide, or silicon oxycarbonitride.

Focusing on semiconductor device 102, but also applicable to semiconductor device 104, semiconductor device 102 includes a subfin region 108 and a semiconductor region that includes a plurality of nanoribbons 112 above the subfin region 108. According to some embodiments, subfin region 108 comprises the same semiconductor material as substrate 101 and is adjacent to dielectric layer 106. According to some embodiments, nanoribbons 112 extend between a source and a drain region to provide an active region for a transistor (e.g., the semiconductor region beneath the gate). The source and drain regions are not shown in the cross-section of FIG. 1A, but are seen in the top-down view of FIG. 1B where nanoribbons 112 of semiconductor device 102 extend between a source region 126a and a drain region 126b (similarly, the nanoribbons 112 of semiconductor device 104 extend between a source region 128a and a drain region 128b). FIG. 1B also illustrates spacer structures 124 on either end of each of semiconductor device 102 and semiconductor device 104 as would be understood to a person skilled in the relevant art. Spacer structures 124 may include a dielectric material, such as silicon nitride.

According to some embodiments, the source and drain regions are epitaxial regions that are provided using an etch-and-replace process. In other embodiments one or both of the source and drain regions could be, for example, implantation-doped native portions of the semiconductor fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

In some embodiments, one or more buried conductive layers 118a and 118b are provided within substrate 101 and adjacent to one or more of the semiconductor devices. In the illustrated example, buried conductive layer 118a is provided within a portion of substrate 101 adjacent to semiconductor device 102 and buried conductive layer 118b is provided within a portion of substrate 101 adjacent to semiconductor device 104. Each of buried conductive layers 118a and 118b are BPR structures that can be any conductive material, such as any metal or metal alloy, that may include any of tungsten, molybdenum, ruthenium, cobalt, copper, aluminum, or silver. According to some embodiments, semiconductor device 102 is an n-channel device and buried conductive layer 118a provides a VSS power rail while semiconductor device 104 is a p-channel device and buried conductive layer 118b provides a VDD power rail. According to some embodiments, liner dielectric layers (not shown) are provided on sidewalls of the buried conductive layers 118a/118b to provide electrical isolation between the buried conductive layers and any neighboring semiconductor devices. Each of buried conductive layers 118a and 118b may be below dielectric layer 106, or at least below a top surface of dielectric layer 106.

Focusing again on semiconductor device 102, nanoribbons 112 include a gate dielectric 114 that may include a single material layer or multiple stacked material layers. In some embodiments, gate dielectric 114 includes a first dielectric layer such as silicon oxide and a second dielectric layer that includes a high-k material such as hafnium oxide, with the first dielectric layer being between a given nanoribbon 112 and the second dielectric layer. In some embodiments, the hafnium oxide may be doped with an element, such as lanthanum, to affect the threshold voltage of the given semiconductor device. Gate dielectric 114 is present around each nanoribbon 112 and may also be present along the sidewalls of adjacent dielectric walls 110.

According to some embodiments, dielectric walls 110 are present along sides of each of semiconductor devices 102 and 104. As seen more clearly in FIG. 1B, dielectric wall 110 may extend parallel to the lengths of nanoribbons 212 (as they extend between the source and drain region) such that they act like traditional gate cut structures. In some other embodiments, dielectric wall 110 extends around all sides of each of semiconductor devices 102 and 104 such that a given semiconductor device can sit within its own "well" formed by four connecting dielectric walls. These dielectric walls 110 may include any composition of silicon and nitrogen or any other dielectric material that exhibits high etch selectivity to silicon oxide. Dielectric walls 110 can also act as gate cut structures that isolate neighboring semiconductor device gates from one another, such as the example illustrated in FIGS. 1A and 1B.

According to some embodiments, each of semiconductor device 102 and 104 includes one or more conductive gate layers such as a first conductive gate layer 116a in semiconductor device 102 and a second conductive gate layer 116b in semiconductor device 104. In some embodiments, first conductive gate layer 116a acts as a first work function gate around nanoribbons 112 of first semiconductor device 102 and second conductive gate layer 116b acts as a second work function gate around nanoribbons 112 of second semiconductor device 104. In some embodiments, semiconductor device 102 is an n-channel device and first conductive gate layer 116a is an n-channel work function metal that includes titanium. In one example, first conductive gate layer 116a includes titanium, aluminum, carbon, and oxygen (TiAlCO). In some embodiments, semiconductor device 104 is a p-channel device and second conductive gate layer 116b is a p-channel work function metal that includes tungsten. In some embodiments, first conductive gate layer 116a and second conductive gate layer 116b are the same conductive material. Other metals or sufficiently conductive materials may be used as well for either the n-channel or p-channel devices. A metal fill 120 may be present on both first conductive gate layer 116a and second conductive gate layer 116b. Metal fill 120 may include tungsten (W) or a combination of titanium nitride (TiN) and tungsten (W), to name a few examples. In some embodiments, a first fill metal with a first material composition is used over semiconductor device 102 and a second fill metal with a second different material composition is used over semiconductor device 104.

According to some embodiments, metal fill 120 also forms conductive vias 122a and 122b that extend through a thickness of dielectric layer 106 and contact corresponding buried conductive layers 118a and 118b. Description herein focuses on semiconductor device 102 with conductive via 122a, but it is equally applicable to semiconductor device 104 and conductive via 122b. Conductive via 122a may be formed adjacent to dielectric wall 110, adjacent semiconductor device 102, or at least between dielectric wall 110 and semiconductor device 102. Metal fill 120 may seamlessly cover the underlying first conductive gate layer 116a and extend into an opening formed through dielectric layer 106 to form conductive via 122a. Although conductive via 122a is illustrated as having straight walls, it should be understood that the walls may have a tapered profile, such as a narrowing profile as conductive via 122a extend towards buried conductive layer 118a.

According to some embodiments, the width of conductive via 122a is determined by a thickness of the deposited first conductive gate layer 116a. That is, the etch used to form the via opening is self-aligned based on the presence of first conductive gate layer 116a along the sides of the etching region, as will be discussed in more detail herein. In some embodiments, the width of conductive via 122a at its widest point (e.g., along the top surface of dielectric layer 106) is between about 8 nm and about 15 nm. The height of conductive via 122a depends on the thickness of dielectric layer 106 and may be between about 10 nm and about 30 nm. The top-down view of the structure seen in FIG. 1B shows how a portion of the underlying buried conductive layers 118a and 118b are exposed following the via opening etch (e.g., before any metal fill is deposited). It should be noted that the top-down view is not drawn to scale in order to clearly label the various structures.

Fabrication Methodology

Figure 2A:
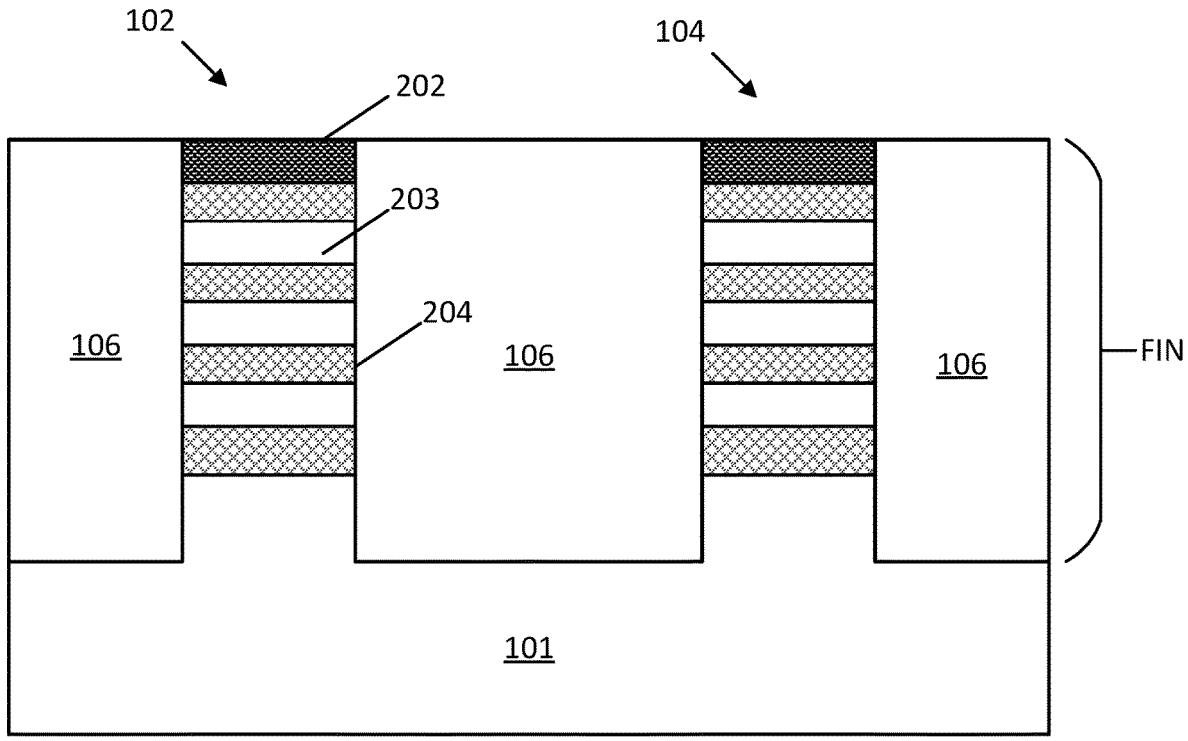
FIGS. 2A-2N are cross-section views that illustrate various stages in an example process for forming the gate tie structures of FIGS. 1A and 1B, in accordance with some embodiments of the present disclosure.
Figure 2B:
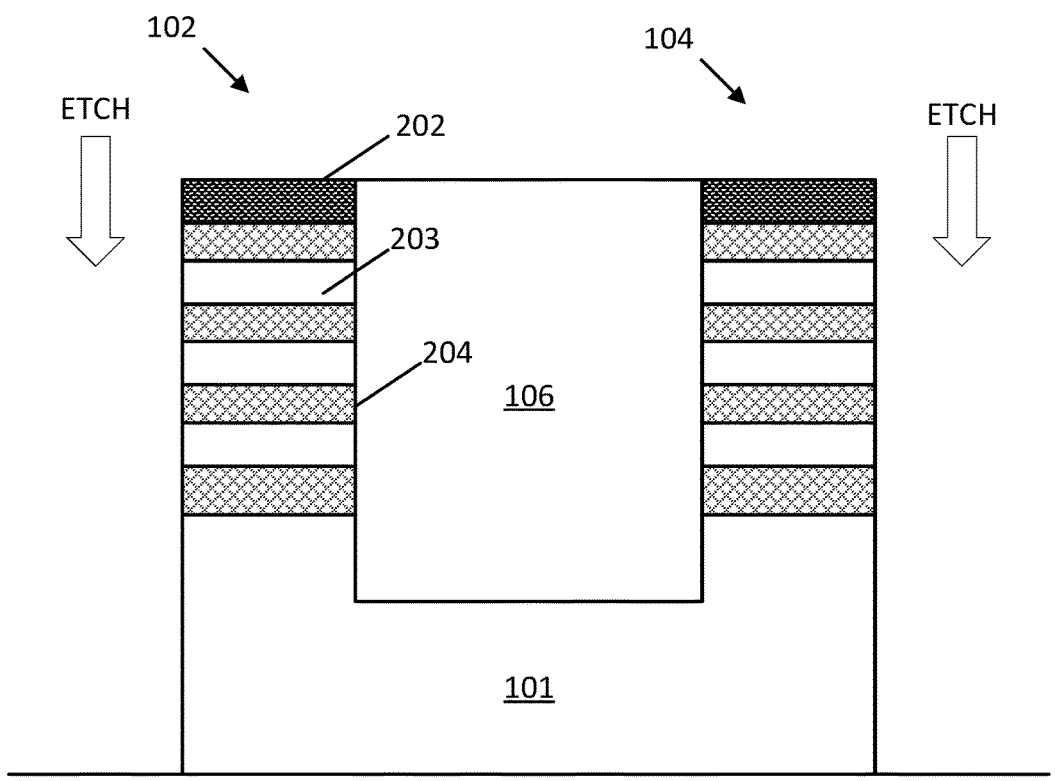
Figure 2C:
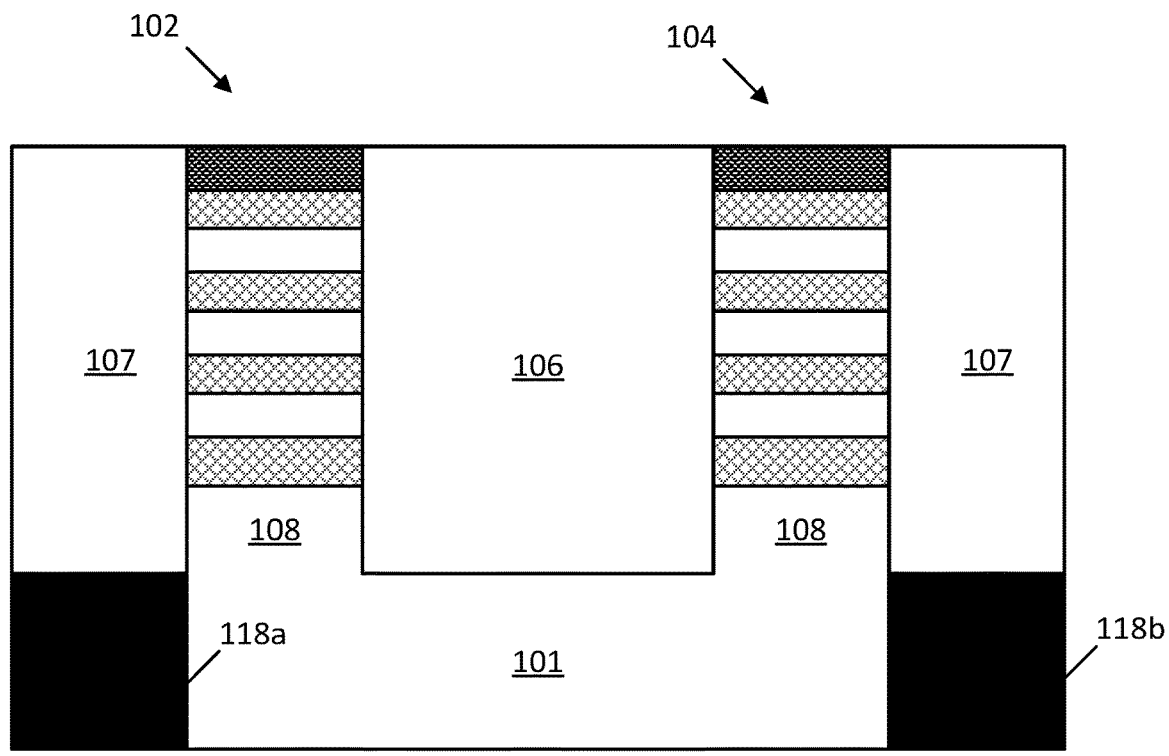
Figure 2D:
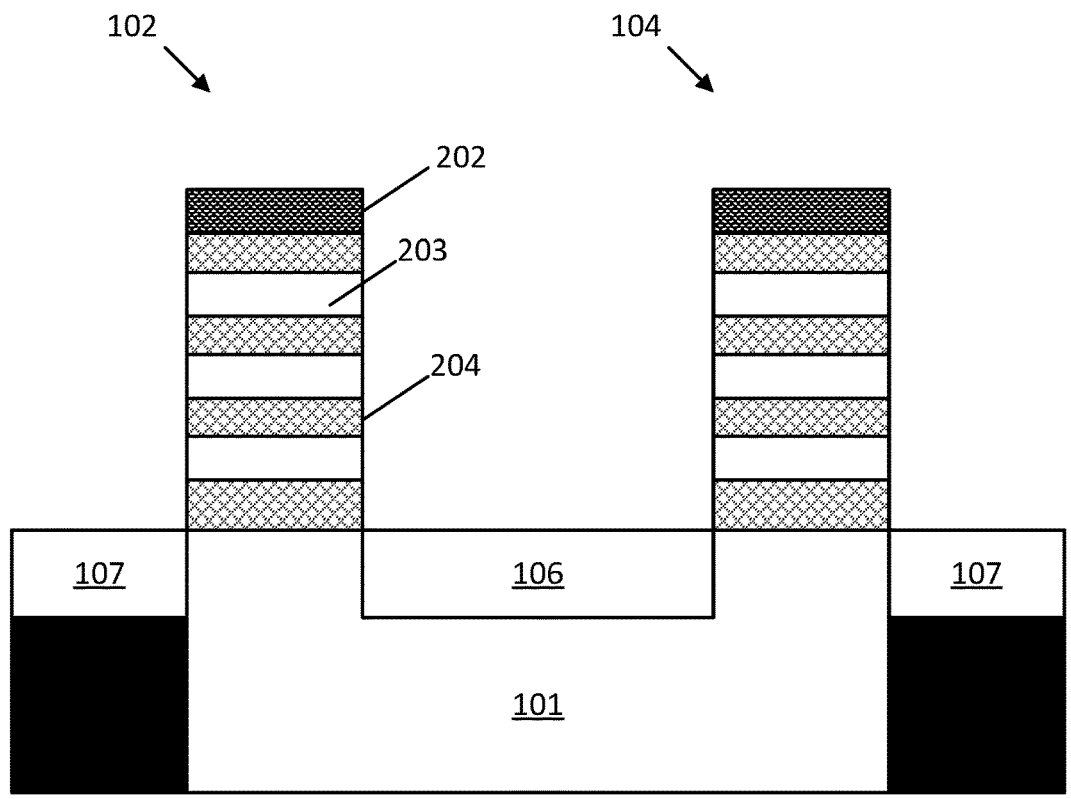
Figure 2E:
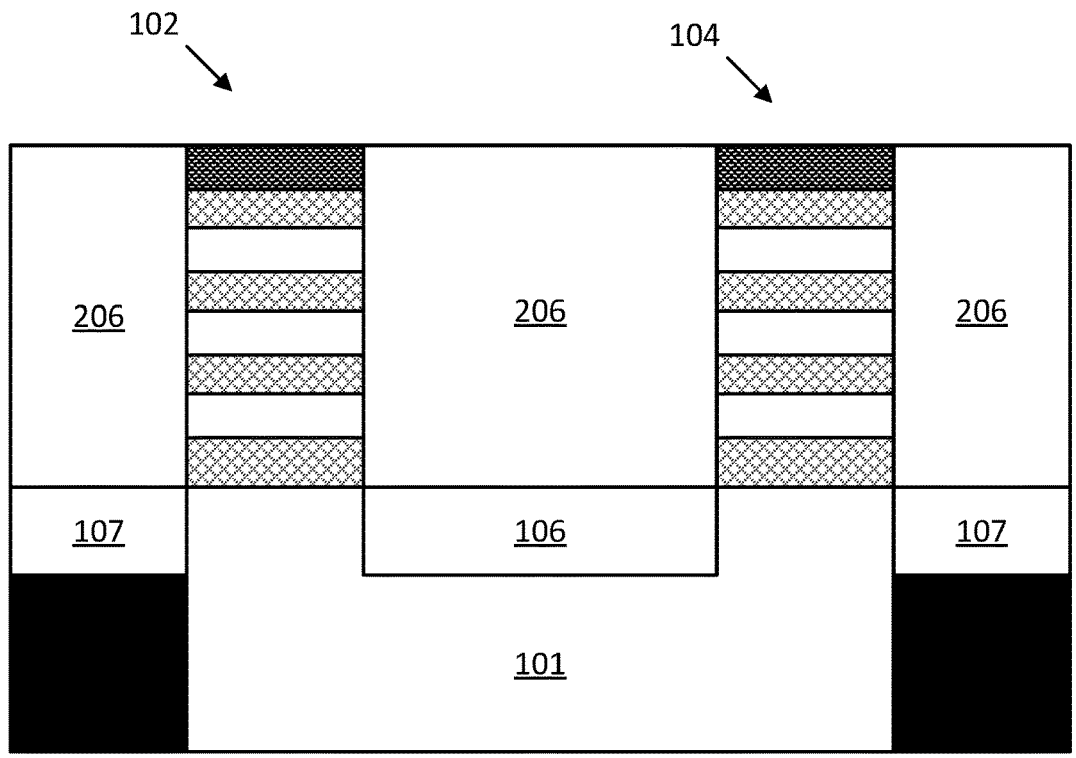
Figure 2F:
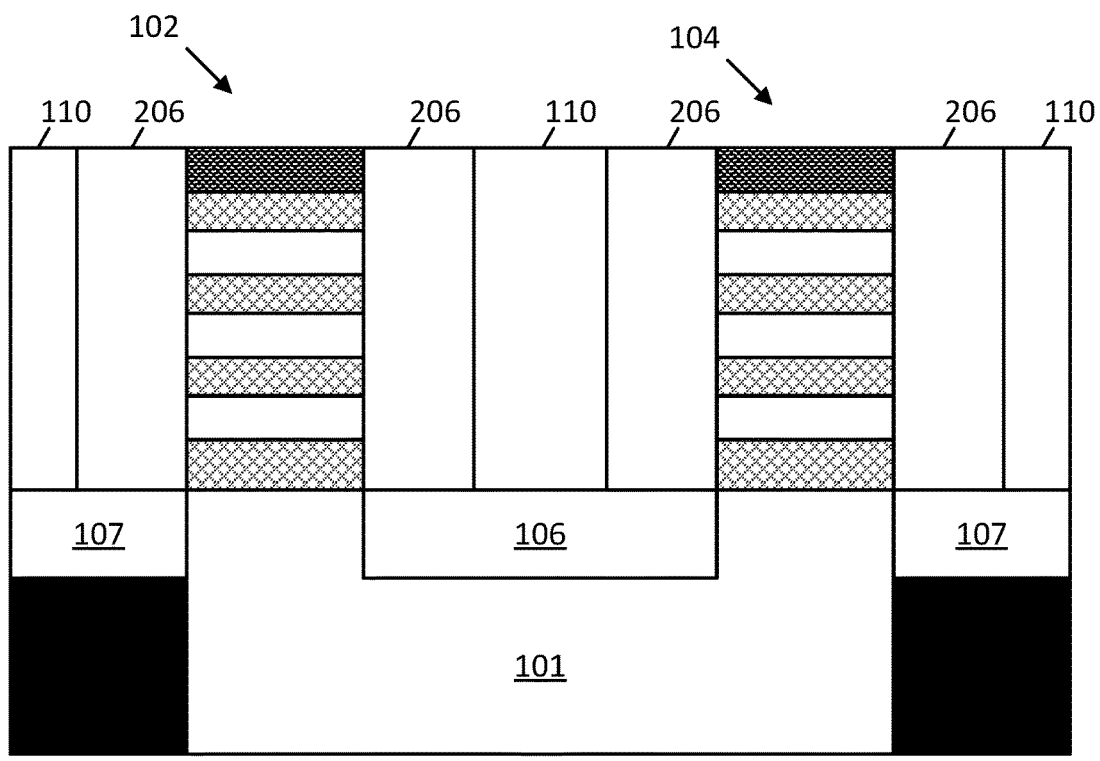
Figure 2G:
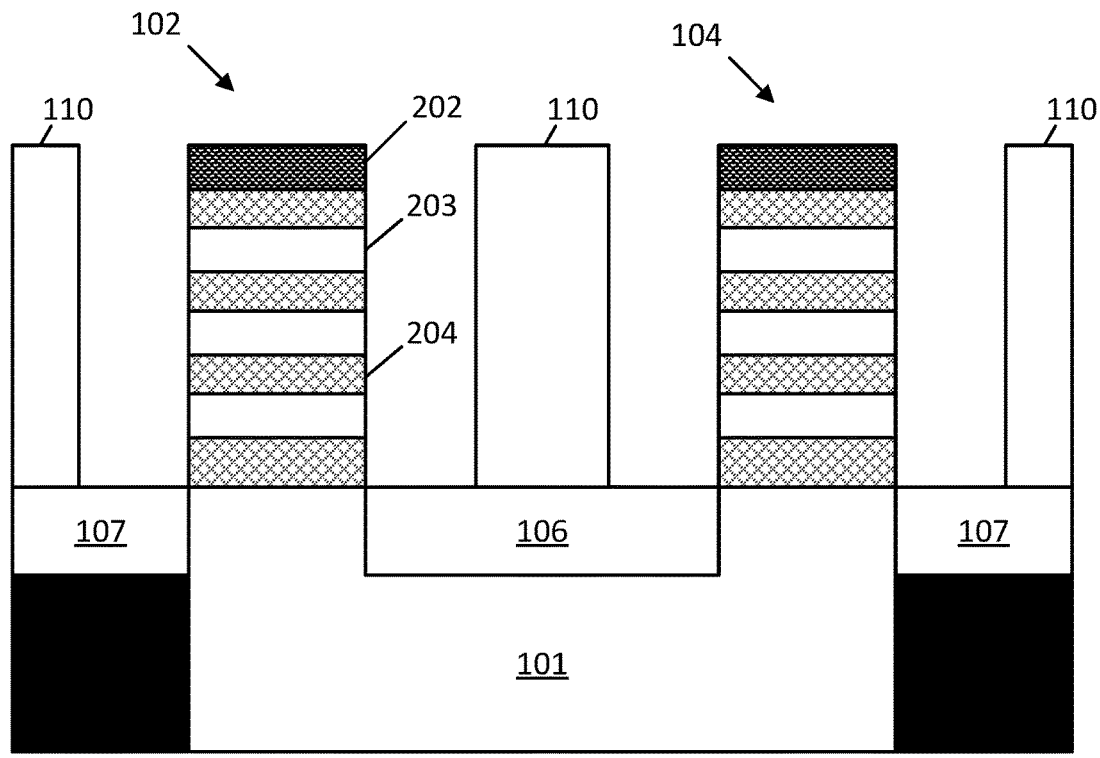
Figure 2H:
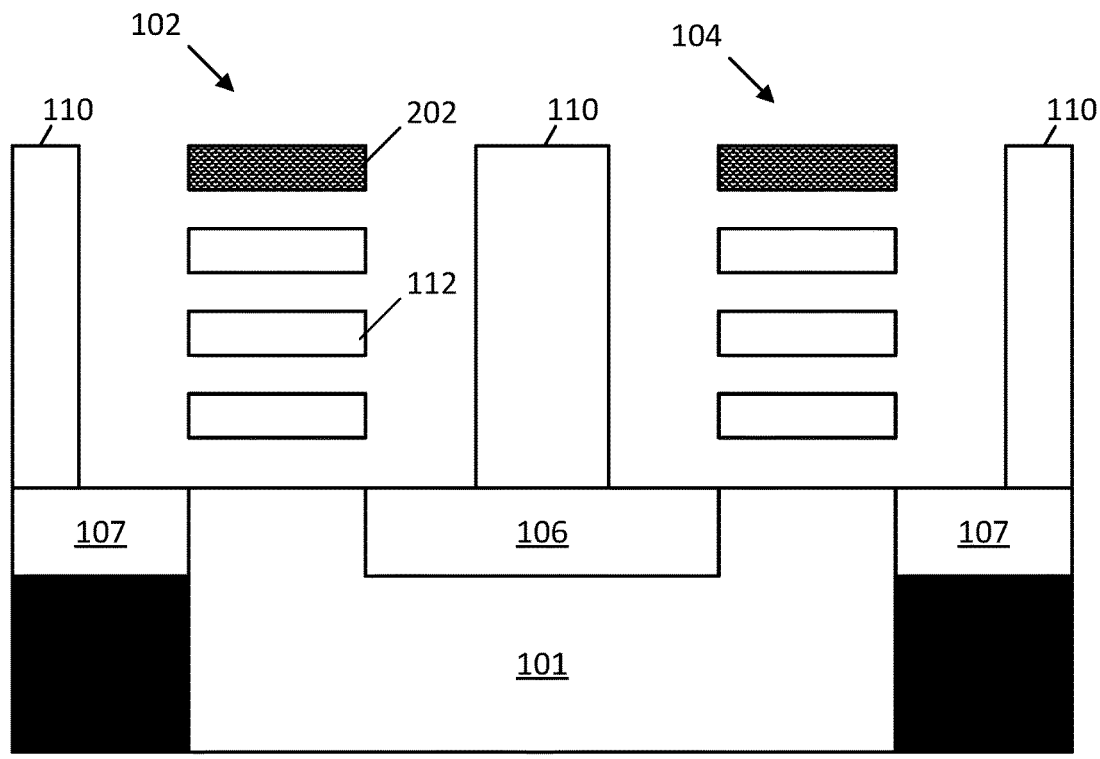
Figure 2I:
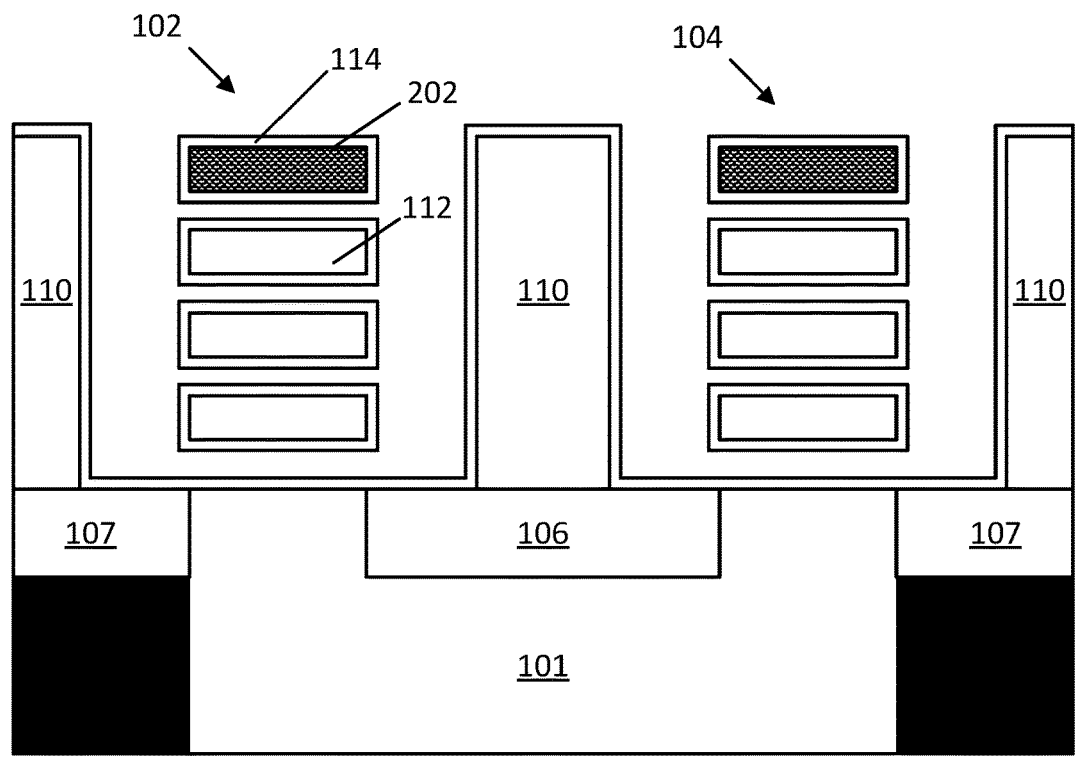
Figure 2J:
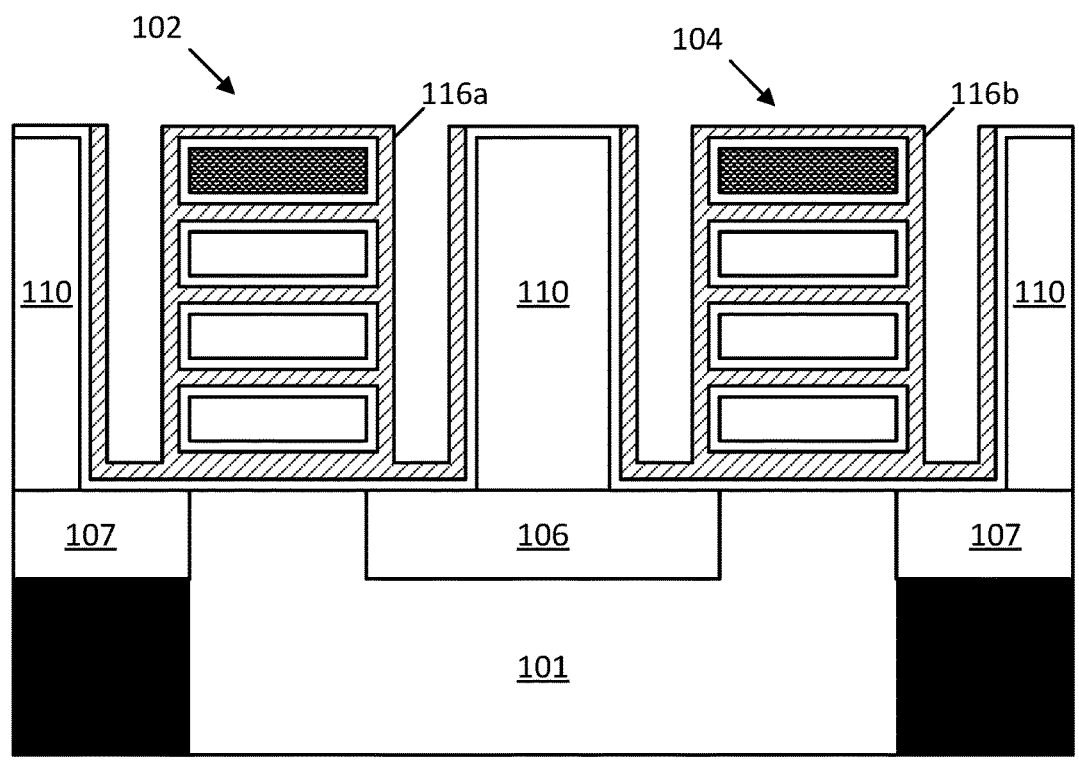
Figure 2K:
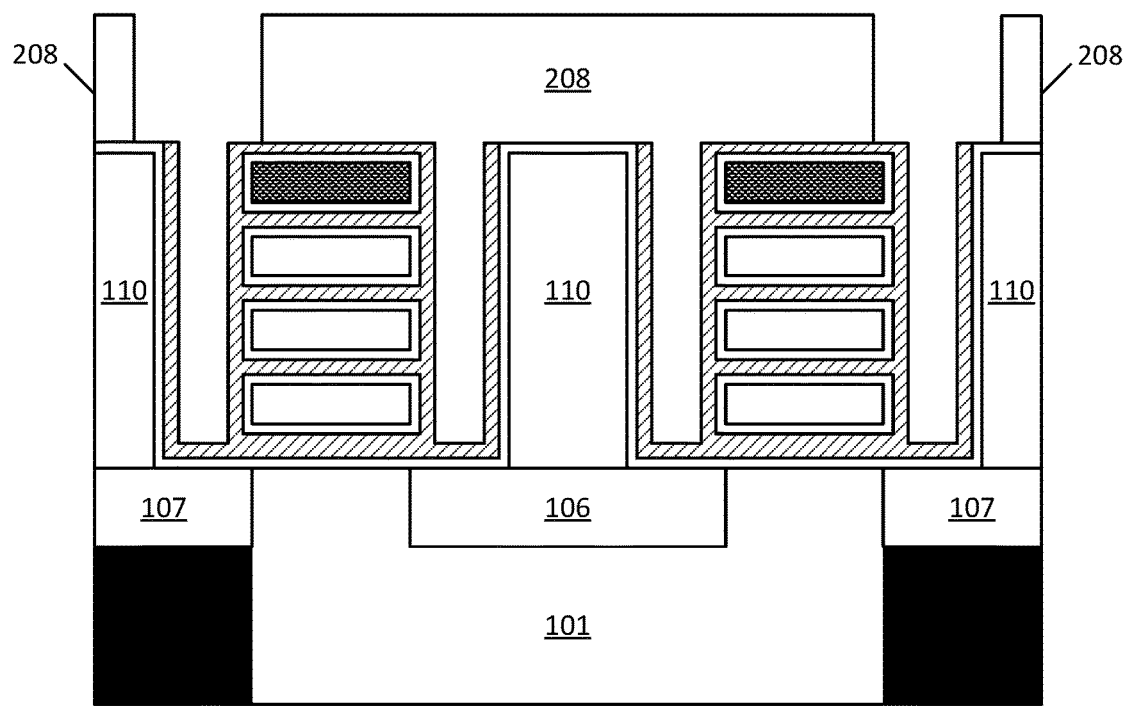
Figure 2L:
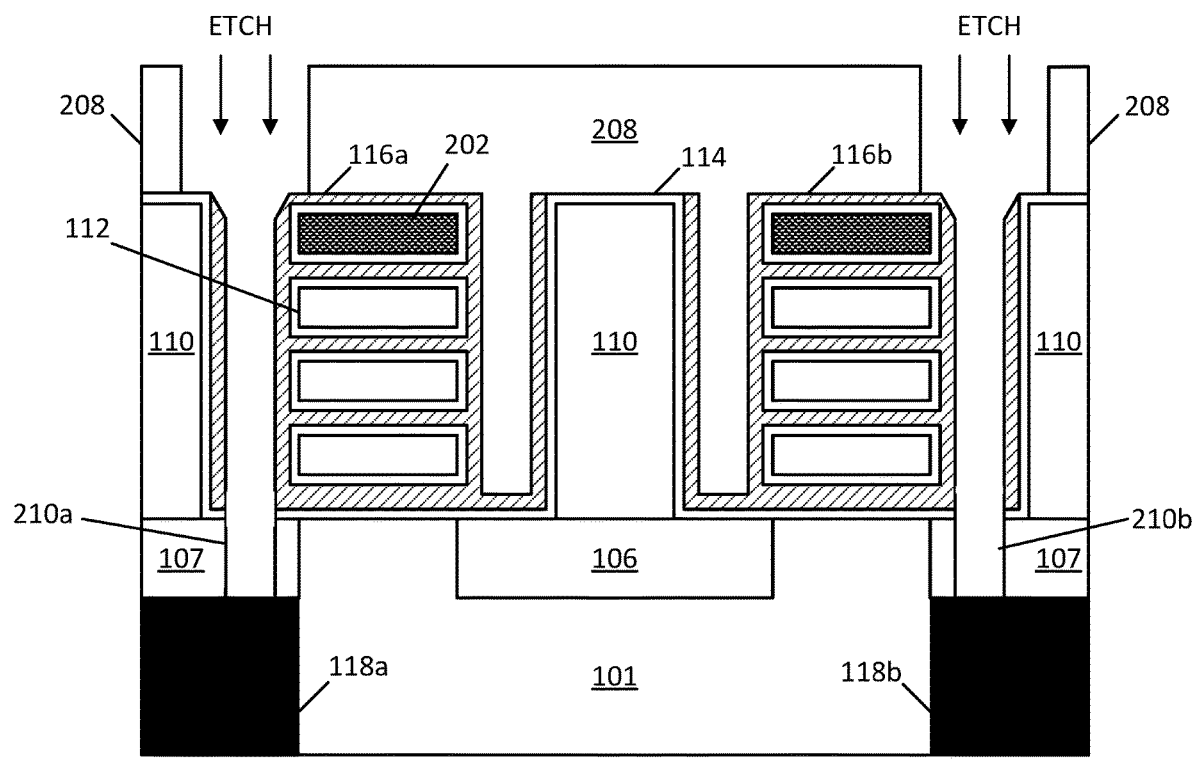
Figure 2M:
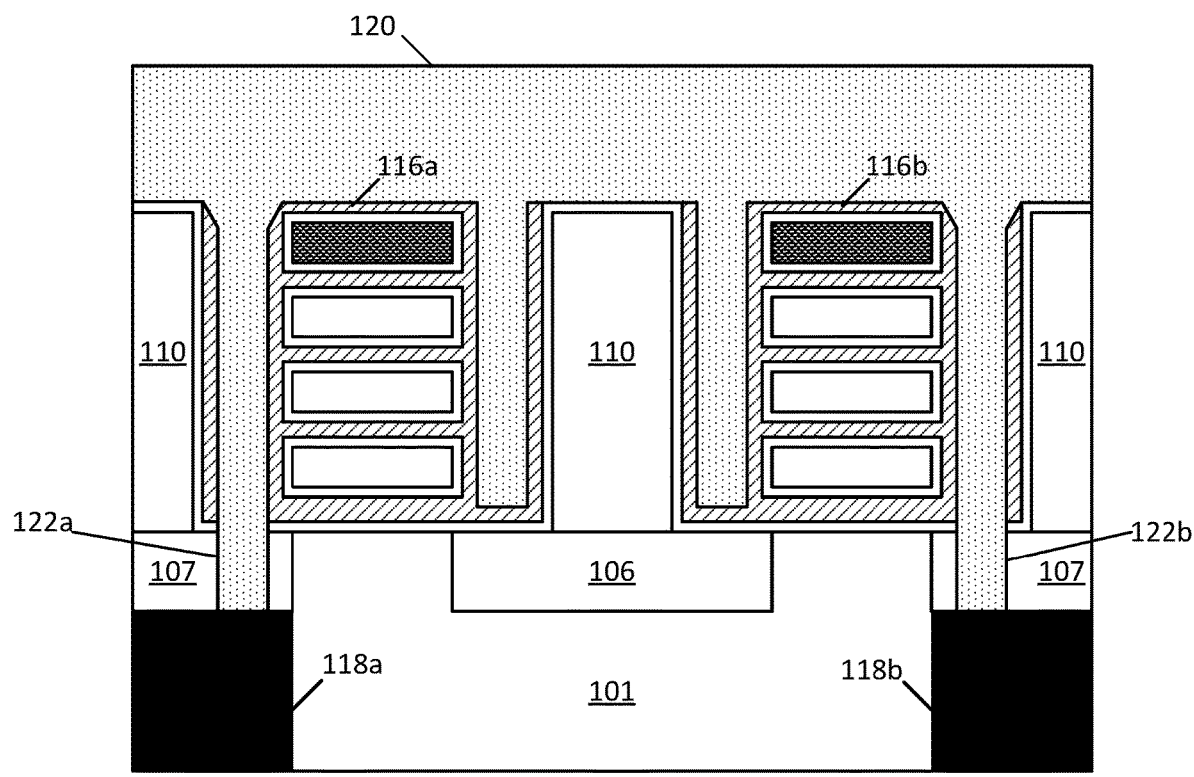
Figure 2N:
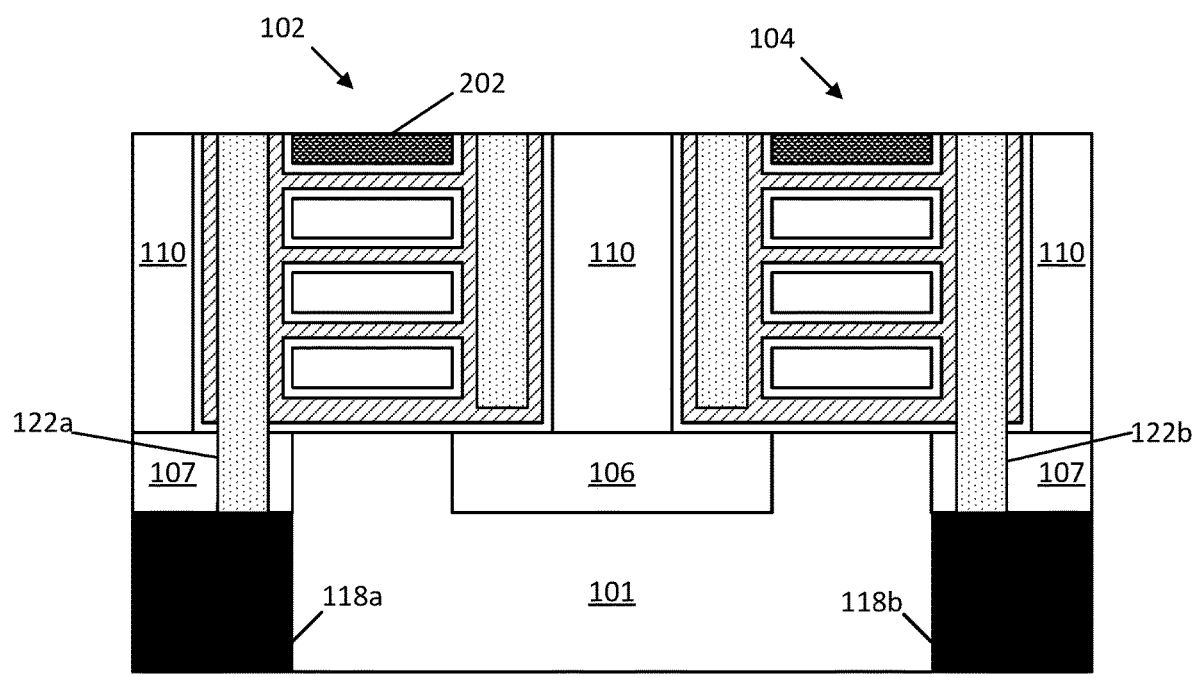

FIGS. 2A-2N include cross-sectional views that collectively illustrate an example process for forming an integrated circuit configured with semiconductor devices having gate tie down structures to buried conductive layers, in accordance with an embodiment of the present disclosure. Each figure shows an example structure that results from the process flow up to that point in time, so the depicted structure evolves as the process flow continues, culminating in the structure shown in FIG. 2N, which is similar to the structure shown in FIG. 1A. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

FIG. 2A illustrates a cross-sectional view taken through and perpendicular to a set of fins of semiconductor devices 120 and 104 extending from substrate 101, according to an embodiment of the present disclosure. The previous relevant discussion with respect to example configurations and materials for the substrate 101 and the fins as well as dielectric layer 106 is equally applicable here. The fins can be native to the substrate, as illustrated, or non-native to the substrate, or multi-layer fins suitable for forming nanowires or nanoribbons. In this example, the fins of semiconductor devices 102 and 104 include alternating layers of material in order to ultimately form nanowires or nanoribbons in a gate-all-around (GAA) structure. In other examples, the fins include a single semiconductor material (e.g., silicon or germanium) for a tri-gate or finFET structure. In some embodiments, the fins can be alternating with respect to transistor polarity. For instance, the fin of semiconductor device 102 can include an NMOS material fin (e.g., silicon fin doped with p-type dopants) and the fin of semiconductor device 104 can include a PMOS material fin (e.g., SiGe fin or silicon fin doped with n-type dopants) for a first logic or memory cell. Numerous other configurations can be used, including fins included in integrated circuit sections other than memory or logic sections, such as analog mixed signal sections, input/output sections, radio frequency or transducer sections.

According to some embodiments, a cap layer 202 is left on the top of each fin. This cap layer 202 may have been used as a hard mask to pattern the fins during a reactive ion etching (RIE) process. As will be discussed in more detail herein, the cap layer 202 may remain during subsequent processing steps to act as a dummy ribbon structure to protect the underlying semiconductor ribbons when forming the gate tie down structures. In cases where dielectric layer 106 is an oxide (e.g., silicon dioxide), cap layer 202 can be, for instance, a nitride, oxynitride, a carbide, or an oxycarbonitride so as to provide etch selectivity with respect to dielectric layer 106.

In this example, each of the fins includes alternating layers of semiconductor material 203 and sacrificial layers 204. Semiconductor material 203 may include silicon, germanium, or an alloy thereof. Sacrificial layers 204 have a different material composition than semiconductor material 203. In some embodiments, sacrificial layers 204 include some combination of silicon and germanium (SiGe). According to some embodiments, semiconductor material 203 will ultimately form the semiconductor regions that extend between a source and a drain region for each of semiconductor devices 102 and 104.

FIG. 2B depicts the cross-section view of the structure shown in FIG. 2A following an etching process to create recesses where the buried power rails will be formed. A lithography mask (not shown) is patterned to expose the regions of the structure to be etched. The lithography mask can be any suitable mask such as, for instance, photoresist or one or more layers (e.g., carbon hard mask or an anti-reflective coating film or a silicon oxynitride) that provide the desired etch selectivity. Any number of wet and/or dry etching techniques can be used to etch the trenches where the buried power rails will be formed. In this example case, the etch scheme includes a dielectric dry etch that is selective to cap layer 202, to remove any of dielectric layer 106 (e.g., silicon dioxide) exposed by the opening in the lithography mask. Once the base of the substrate 101 is reached, the example etch scheme includes an RIE process to etch the remainder of the trench within the substrate 101.

While dimensions can vary from one example embodiment to the next, in one example case, the total height from the bottom of the etched trench in substrate 101 to the top of cap layer 202 can be 250 nm or more, with the portion of substrate 101 etched by RIE being in the range of 50 to 100 nm, and with the fins above having a height in the range of 50 to 200 nm (e.g., 60 to 100 nm), and the cap layer 202 having a height in the range of 5 to 10 nm. The width of the fins can be, for example, in the range of 5 to 40 nm. The pitch between neighboring fins can be, for example, in the range of 35 to 120 nm. In some such example embodiments, a width-to-height aspect ratio of the fins is in the range of about 1:5 to 1:50, such as the specific example case where the fins are about 10 nm wide at their mid-point, and about 200 nm tall, so as to provide a 1:20 width-to-height aspect ratio.

FIG. 2C depicts the cross-section view of the structure shown in FIG. 2B following the formation of the buried power rails. Each of buried conductive layers 118a and 118b can be deposited by, for example, electroplating, electroless plating, chemical vapor deposition (CVD), physical vapor deposition (PVD) or atomic layer deposition (ALD). It should be noted that in some embodiments, a liner dielectric layer is deposited to cover the sidewalls of the etched trenches before depositing buried conductive layers 118a and 118b. Any excess amount of buried conductive layers 118a/118b extending out of the trench (e.g., above cap layer 202) can be polished away by way of a planarization/polishing technique such as chemical mechanical polishing (CMP). Afterwards, the buried conductive layers 118a/118b can be recessed using an isotropic metal etch process selective to dielectric layer 106 and cap layer 202. The depth of the recess will depend on the desired height of the final buried power rails, but in some example cases is in the range of 50 to 250 nm (e.g., 70 to 130 nm). The height of the recessed buried conductive layers 118a/118b can vary as well, but in some example cases, is in the range of about 50 to 200 nm (e.g., 60 to 120 nm).

As noted above, buried conductive layers 118a/118b can be any number of conductive materials, such as tungsten, molybdenum, ruthenium, cobalt, copper, aluminum, silver, or alloys thereof. Although buried conductive layers 118a/118b are formed to be beneath the subfin portions 108 of the fins, this is not required and in some examples the buried conductive layers 118a/118b are formed adjacent to a portion of subfins 108. Further note that buried conductive layers 118a/118b can run parallel to the fins for any desired distance. Following the recessing of buried conductive layers 118a/118b, another dielectric layer 107 is added over the buried conductive layers 118a/118b and planarized using, for example, CMP. Dielectric layer 107 may be the same as dielectric layer 106.

FIG. 2D depicts the cross-section view of the structure shown in FIG. 2C following the recessing of dielectric layers 106 and 107. In some embodiments, dielectric layers 106 and 107 are the same material such that the layers are recessed back together at the same rate using any suitable dry or wet etching process that is selective to layers 202-204. In some embodiments, layer 202 includes a nitride (e.g., silicon nitride), the fins include silicon or germanium materials (e.g., layers 203 are silicon and layers 204 are SiGe), and dielectric layers 106 and 107 are an oxide (e.g., silicon dioxide), so as to allow for a singular etch selectivity with respect to the fins.

While dimensions can vary from one example embodiment to the next, in one example case, the total height of the fins that extend above dielectric layers 106 and 107 may be between 50 nm and 150 nm, and the width of the fins can be, for example, in the range of 5 to 100 nm. The thickness of each layer of semiconductor material 203 and sacrificial layer 204 may be between about 5 nm and about 25 nm.

FIG. 2E depicts the cross-section view of the structure shown in FIG. 2D following the formation of a sacrificial gate 206. Sacrificial gate 206 may include any material that can be safely removed later in the process without etching or otherwise damaging any portions of the fins. In some embodiments, sacrificial gate 206 includes polysilicon. In some embodiments, sacrificial gate 206 extends over the top surfaces of cap layer 202.

Following the formation of sacrificial gate 206, additional semiconductor device structures are formed that are not shown in these cross-sections. These additional structures include spacer structures on the edges of the sacrificial gate 206 and source and drain regions on either ends of each of the fins. The formation of such structures would be well understood to a person skilled in the relevant art.

FIG. 2F depicts the cross-section view of the structure shown in FIG. 2E following the formation of dielectric walls 110 between adjacent fins. Another lithography mask (not shown) is patterned to expose the regions of sacrificial gate 206 to be etched away and replaced with dielectric material to form dielectric walls 110. The lithography mask can be any suitable mask such as, for instance, photoresist or one or more layers (e.g., carbon hard mask or an anti-reflective coating film or a silicon oxynitride) that provide the desired etch selectivity. Any wet or dry etching technique can be used to etch through sacrificial gate 206 and stop at the underlying dielectric layer 106/107. Once the trenches have been formed through sacrificial gate 206, they may be filled using a suitable dielectric material to from dielectric walls 110. In some embodiments, the dielectric material is silicon nitride and is deposited using any one of CVD, PVD, or PECVD. Any excess dielectric material extending out from the trenches can be polished back using, for example, CMP.

FIG. 2G depicts the cross-section view of the structure shown in FIG. 2F following the removal of sacrificial gate 206. Any wet or dry etching process may be used to remove sacrificial gate 206 while maintaining the semiconductor material present within the fins. Furthermore, dielectric walls 110 remain following the removal of sacrificial gate 206.

FIG. 2H depicts the cross-section view of the structure shown in FIG. 2G following the removal of sacrificial layers 204 from the fins. According to some embodiments, sacrificial layers 204 are removed using a selective isotropic etching process that removes the material of sacrificial layers 204 but does not remove (or removes very little of) the layers of semiconductor material 203. At this point, the exposed layers of semiconductor material 203 form nanoribbons 112 that extend between source and drain regions in each of semiconductor device 102 and 104. Note that cap layer 202 also remains as a dummy ribbon extending in the same direction as each of the lower nanoribbons 203. In some embodiments, the distance between cap layer 202 and the adjacent lower nanoribbon 112 is larger than the distance between any pair of adjacent nanoribbons in the same nanoribbon stack.

FIG. 2I depicts the cross-section view of the structure shown in FIG. 2H following the formation of gate dielectric 114. Gate dielectric 114 may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, gate dielectric 114 is hafnium oxide with a thickness between about 2 nm and about 10 nm. In some embodiments, gate dielectric 114 may include one or more silicates (e.g., titanium silicate, tungsten silicate, niobium silicate, and silicates of other transition metals). Gate dielectric 114 may be a multilayer structure, in some examples. For instance, gate dielectric 114 may include a first layer on nanoribbons 112, and a second layer on the first layer. The first layer can be, for instance, an oxide of nanoribbons 112 (e.g., silicon dioxide) and the second layer can be a high-k dielectric material (e.g., hafnium oxide). In some embodiments, an annealing process may be carried out on gate dielectric 114 to improve its quality or to drive in dopants when high-k dielectric material is used.

FIG. 2J depicts the cross-section view of the structure shown in FIG. 2I following the formation of conductive layers 116a and 116b. In some embodiments, both conductive layers 116a and 116b are the same material (e.g., deposited together during the same deposition process) and may include titanium or tungsten. In some embodiments, semiconductor device 102 is an n-channel device and first conductive layer 116a is an n-channel work function metal that includes titanium. In one example, first conductive layer 116a includes titanium, aluminum, carbon, and oxygen (TiAlCO). In some embodiments, semiconductor device 104 is a p-channel device and second conductive layer 116b is a p-channel work function metal that includes tungsten.

Conductive layers 116a and 116b may be deposited using any known metal deposition technique, such as CVD, ALD, or PECVD. Each of conductive layers 116a and 116b may have a deposited thickness between about 0.5 nm and about 5 nm. In some embodiments, conductive layers 116a and 116b are deposited to a thickness sufficient enough to fill the voids between adjacent nanoribbons of the corresponding semiconductor device. Conductive layers 116a and 116b are also formed along the sidewalls of any adjacent dielectric walls 110. Following the deposition of conductive layers 116a and 116b, a dielectric fill may be deposited to fill the spaces between the nanoribbon stacks and dielectric walls 110. In some embodiments, the dielectric fill is silicon oxide although any other dielectric materials may be used as well. Following the deposition of the dielectric fill, any excess dielectric fill above the top surface of dielectric wall 110 is removed along with any portion of conductive layers 116a or 116b over the top surface of dielectric wall 110. Polishing may be performed using one or more rounds of chemical mechanical polishing (CMP) to produce a planarized top surface. According to some embodiments, the dielectric fill is subsequently removed using any wet or dry isotropic dielectric etching procedure.

FIG. 2K depicts the cross-section view of the structure shown in FIG. 2J following the formation of masking layer 208. According to some embodiments, masking layer 208 is patterned to provide openings between the nanoribbon stack and an adjacent dielectric wall of each of semiconductor devices 102 and 104. In some embodiments, the openings in masking layer 208 are aligned over at least a portion of buried conductive layers 118a and 118b. Masking layer 208 can be any suitable mask material used for lithography purposes such as, for instance, photoresist or one or more layers (e.g., carbon hard mask or an anti-reflective coating film or a silicon oxynitride) that provide the desired etch selectivity to allow for forming the gate tie-down vias. Note how masking layer 208 need not be perfectly aligned to the edges of conductive layers 116a and 116b.

FIG. 2L depicts the cross-section view of the structure shown in FIG. 2K following one or more etching processes to form via openings 210a and 210b. According to some embodiment, a series of anisotropic RIE processes may be performed to punch through the different material layers and form via openings 210a and 210b through the thickness of dielectric layer 107. For example, a first RIE process may be used to punch through each of conductive layers 116a and 116b. During this etching process, the top corners of the exposed conductive layers 116a and 116b may also be removed. However, this corner removal of conductive layers 116a and 116b is not a concern as any damage would only be caused to the dummy ribbon formed from cap layer 202. A second RIE process may be used to punch through gate dielectric 114. In some embodiments, the same RIE process is used to etch through gate dielectric 114 and form via openings 210a and 210b. In some other embodiments, a different RIE process is used to etch through dielectric layer 107 than the one used to punch through gate dielectric 114. According to some embodiments, the etching process is complete once the underlying buried conductive layers 118a and 118b are exposed by the etching process. Note that the semiconductor nanoribbons 112 are protected from the etch by virtue of the dummy nanoribbon structure formed by gate layer 202.

The etched via openings 210a and 210b are aligned adjacent to sidewalls of dielectric walls 110. In some embodiments, etched via openings 210a and 210b are aligned directly along one or more material layers on the sidewalls of dielectric walls 110, such as gate dielectric 114 and/or conductive layers 116a/116b. In some embodiments, via opening 210a is formed directly between the portion of conductive layer 116a on the sidewall of dielectric wall 110 and the portion of conductive layer 116a around nanoribbons 112 of semiconductor device 102, and via opening 210b is formed directly between the portion of conductive layer 116b on the sidewall of dielectric wall 110 and the portion of conductive layer 116b around nanoribbons 112 of semiconductor device 104. With via openings 210a and 210b formed, mask 208 can be removed, which can be done using an ash-based etch, or other suitable mask removal etch process.

FIG. 2M depicts the cross-section view of the structure shown in FIG. 2L following the deposition of metal fill 120. According to some embodiments, the same metal fill 120 is present on both first conductive layer 116a and second conductive layer 116b. Metal fill 120 may include tungsten (W) or a combination of titanium nitride (TiN) and tungsten (W), to name a few examples. In some embodiments, a first fill metal with a first material composition is deposited over first conductive layer 116a and a second fill metal with a second different material composition is deposited over second conductive layer 116b.

Depositing metal fill 120 around first conductive layer 116a and second conductive layer 116b also causes metal fill 120 to enter into via openings 210a and 210b and form conductive vias 122a and 122b, respectively, which extend through a thickness of dielectric layer 107 and contact corresponding buried conductive layers 118a and 118b. According to some embodiments, metal fill 120 seamlessly transitions between contacting first conductive layer 116a and buried conductive layer 118a by way of conductive via 122a, and seamlessly transitions between contacting second conductive layer 116b and buried conductive layer 118b by way of conductive via 122b.

FIG. 2N depicts the cross-section view of the structure shown in FIG. 2M following a polishing process to remove excess metal fill 120. The polishing planarizes the structure and removes any excess metal fill 120 to prevent it from causing an electrical short between different semiconductor devices. Any number of CMP processes may be performed to planarize the structure. In some embodiments, the structure is polished until cap layer 202 is reached, this leaving behind at least a portion of cap layer 202 and the corresponding dummy ribbon. In some other embodiments, the structure is polished down low enough that cap layer 202 is fully removed.

Figure 3:
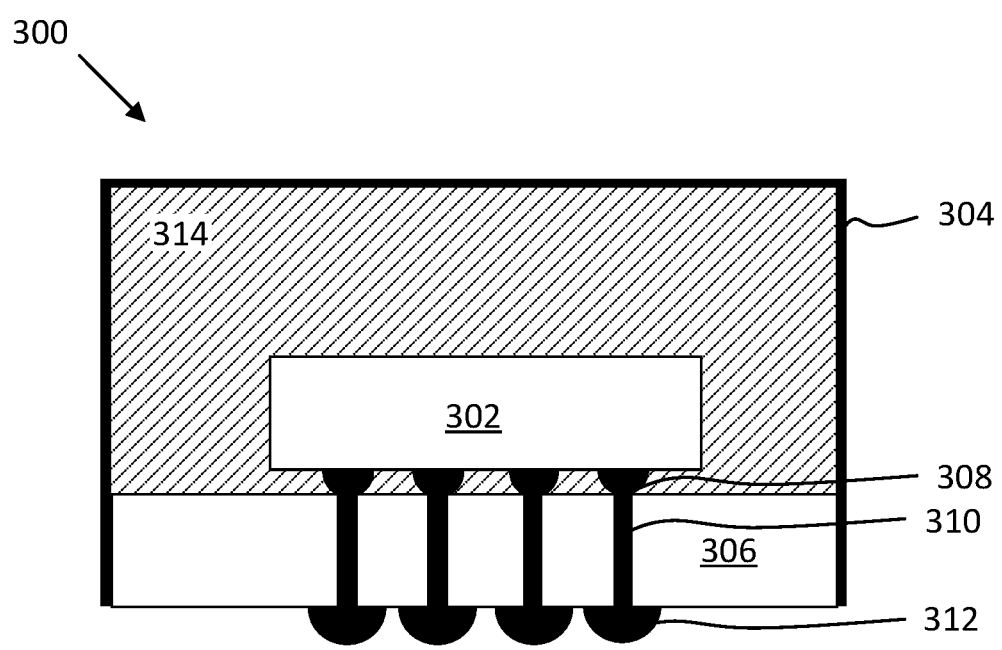
FIG. 3 illustrates a cross-section view of a chip package containing one or more semiconductor dies, in accordance with some embodiments of the present disclosure.

FIG. 3 illustrates an example embodiment of a chip package 300, in accordance with an embodiment of the present disclosure. As can be seen, chip package 300 includes one or more dies 302. One or more dies 302 may include at least one integrated circuit having semiconductor devices, such as any of the semiconductor devices disclosed herein. One or more dies 302 may include any other circuitry used to interface with other devices formed on the dies, or other devices connected to chip package 300, in some example configurations.

As can be further seen, chip package 300 includes a housing 304 that is bonded to a package substrate 306. The housing 304 may be any standard or proprietary housing, and may provide, for example, electromagnetic shielding and environmental protection for the components of chip package 300. The one or more dies 302 may be conductively coupled to a package substrate 306 using connections 308, which may be implemented with any number of standard or proprietary connection mechanisms, such as solder bumps, ball grid array (BGA), pins, or wire bonds, to name a few examples. Package substrate 306 may be any standard or proprietary package substrate, but in some cases includes a dielectric material having conductive pathways (e.g., including conductive vias and lines) extending through the dielectric material between the faces of package substrate 306, or between different locations on each face. In some embodiments, package substrate 306 may have a thickness less than 1 millimeter (e.g., between 0.1 millimeters and 0.5 millimeters), although any number of package geometries can be used. Additional conductive contacts 312 may be disposed at an opposite face of package substrate 306 for conductively contacting, for instance, a printed circuit board (PCB). One or more vias 310 extend through a thickness of package substrate 306 to provide conductive pathways between one or more of connections 308 to one or more of contacts 312. Vias 310 are illustrated as single straight columns through package substrate 306 for ease of illustration, although other configurations can be used (e.g., damascene, dual damascene, through-silicon via, or an interconnect structure that meanders through the thickness of substrate 306 to contact one or more intermediate locations therein). In still other embodiments, vias 310 are fabricated by multiple smaller stacked vias, or are staggered at different locations across package substrate 306. In the illustrated embodiment, contacts 312 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 312, to inhibit shorting.

In some embodiments, a mold material 314 may be disposed around the one or more dies 302 included within housing 304 (e.g., between dies 302 and package substrate 306 as an underfill material, as well as between dies 302 and housing 304 as an overfill material). Although the dimensions and qualities of the mold material 314 can vary from one embodiment to the next, in some embodiments, a thickness of mold material 314 is less than 1 millimeter. Example materials that may be used for mold material 314 include epoxy mold materials, as suitable. In some cases, the mold material 314 is thermally conductive, in addition to being electrically insulating.

Methodology

Figure 4:
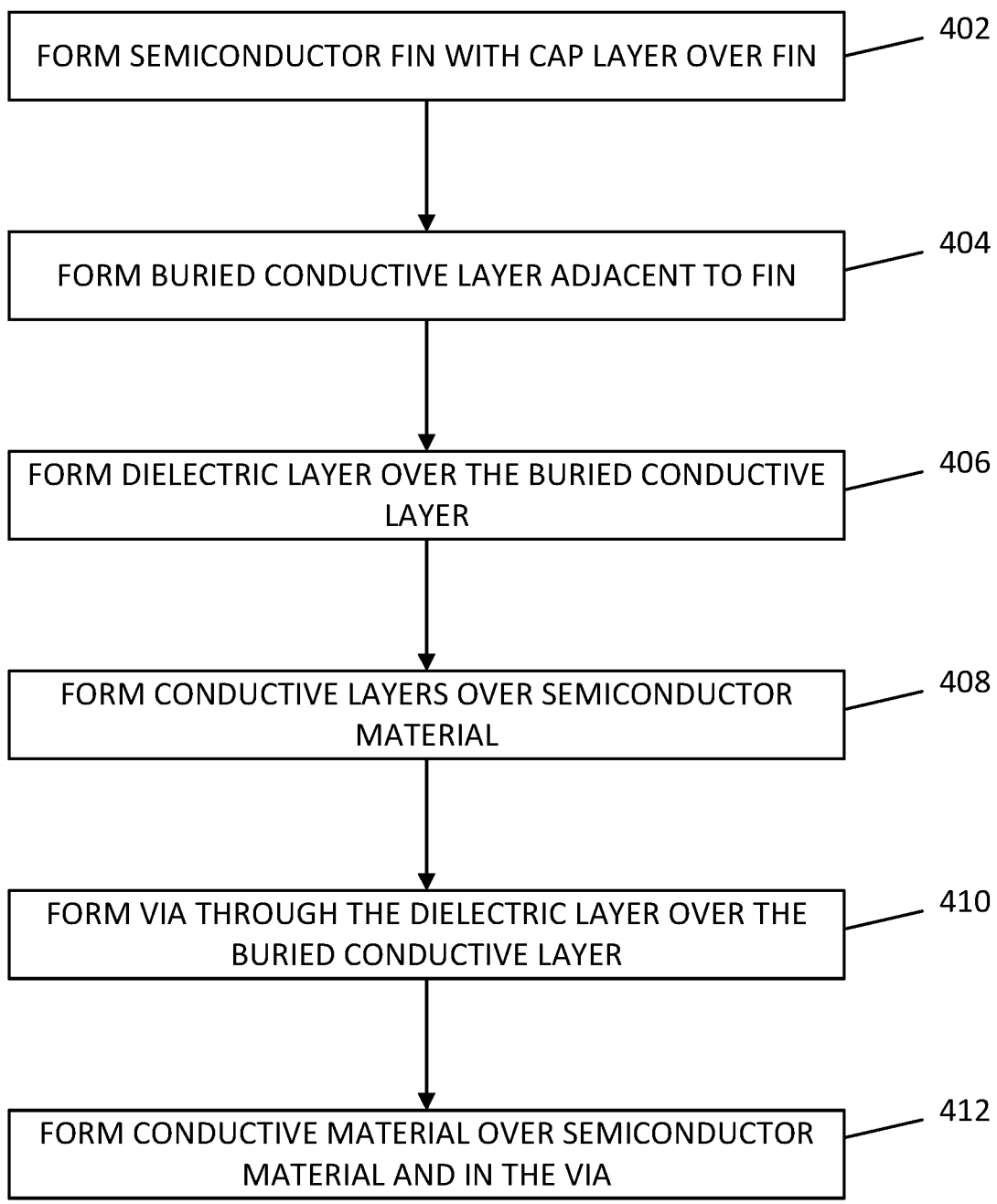
FIG. 4 is a flowchart of a fabrication process for semiconductor devices having gate tie structures, in accordance with an embodiment of the present disclosure.

FIG. 4 is a flow chart of a method 400 for forming at least a portion of an integrated circuit, according to an embodiment. Various operations of method 400 may be illustrated in FIGS. 2A-2N. However, the correlation of the various operations of method 400 to the specific components illustrated in the aforementioned figures is not intended to imply any structural and/or use limitations. Rather, the aforementioned figures provide one example embodiment of method 400. Other operations may be performed before, during, or after any of the operations of method 400. For example, method 400 does not explicitly describe many steps that are performed to form common transistor structures. Some of the operations of method 400 may be performed in a different order than the illustrated order.

Method 400 begins with operation 402 where semiconductor fins are formed with a cap layer over the fins. The fins can be native to the underlying substrate or non-native to the substrate, or multi-layer fins suitable for forming nanowires or nanoribbons. In some examples, the fins include alternating layers of material in order to ultimately form nanowires or nanoribbons in a gate-all-around (GAA) structure. In other examples, the fins include a single semiconductor material (e.g., silicon or germanium) for a tri-gate or finFET structure. Numerous other configurations can be used, including fins included in integrated circuit sections other than memory or logic sections.

According to some embodiments, the cap layer that is used to pattern the location of the fins is left on the top of each fin. The cap layer may remain during subsequent processing steps to act as a dummy structure to protect the underlying semiconductor ribbons (or fin) when forming the gate tie down structures. The cap layer can be, for instance, a nitride, oxynitride, a carbide, or an oxycarbonitride so as to provide etch selectivity with respect to surrounding dielectric fill layers.

Method 400 continues with operation 404 where buried conductive layers are formed in the substrate to act as buried power rails. Any number of wet and/or dry etching techniques can be used to etch trenches through dielectric fill layers and through a portion of the substrate to define areas where the buried power rails will be formed. The etch scheme may include a dielectric dry etch that is selective to the cap layer followed by an RIE process to etch the remainder of the trench through the substrate.

Once the trenches have been etched, conductive material can be deposited within the trenches by, for example, electroplating, electroless plating, CVD, PECVD or ALD. The conductive material can be any number of conductive materials, such as tungsten, molybdenum, ruthenium, cobalt, copper, aluminum, silver, or alloys thereof. It should be noted that in some embodiments, a liner dielectric layer is deposited to cover the sidewalls of the etched trenches before depositing the conductive material. Any excess amount of conductive material extending out of the trench can be polished away by way of a planarization/polishing technique such as CMP. Afterwards, the conductive material is recessed using, for example, an isotropic metal etch process selective to any surrounding dielectric materials. The depth of the recess will depend on the desired height of the final buried conductive layers, but in some example cases is in the range of 20 to 200 nm (e.g., 50 to 130 nm). The height of the recessed buried conductive layers can vary as well, but in some example cases, is in the range of about 20 to 500 nm (e.g., 30 to 90 nm).

Method 400 continues with operation 406 where a dielectric layer is formed over the buried conductive layers. Following the recessing of the buried conductive layers, another dielectric fill is added over the buried conductive layers and subsequently recessed to form a thinner dielectric layer over the buried conductive layers. In some embodiments, the fins include silicon or germanium materials, and the fill is an oxide (e.g., silicon dioxide), so as to allow for a singular etch selectivity with respect to the fins. While dimensions can vary from one example embodiment to the next, in one example case, the total height of the fins that extend above the recessed dielectric layer may be between 50 nm and 150 nm, and the width of the fins can be, for example, in the range of 5 to 100 nm.

Following the formation of the dielectric layer above the buried conductive layers, additional processes are performed to form transistor structures, such as the formation of source and drain regions, removal of sacrificial layers to form nanoribbons (in the case of GAA structures), and formation of a gate dielectric layer over the semiconductor regions of the fin or nanoribbons in each semiconductor device. Some of these processes are illustrated with reference to FIGS. 2E-2I.

Method 400 continues with operation 408 where conductive layers are formed over the semiconductor material (e.g., over the semiconductor fins or over the semiconductor nanoribbons). Note that the conductive layers are also formed over the cap layer that has remained as part of the structure above the semiconductor material. The conductive layers may act as work function metal layers and provide gate electrodes for the transistors. In some embodiments, one or more of the conductive layers includes titanium. In one example, one or more of the conductive layers includes titanium, aluminum, carbon, and oxygen (TiAlCO). In some embodiments, one or more of the conductive layers includes tungsten.

The conductive layers may be deposited using any known metal deposition technique, such as CVD, ALD, or PECVD. Each of the conductive layers may have a deposited thickness between about 0.5 nm and about 5 nm. In some embodiments, the conductive layers are deposited to a thickness sufficient enough to fill the voids between adjacent nanoribbons of the corresponding semiconductor device (e.g., in GAA structures).

Method 400 continues with operation 410 where gate tie-down via openings are formed through the dielectric layer over the buried conductive layers. According to some embodiment, a series of anisotropic RIE processes may be performed to punch through different material layers to form the via openings through the thickness of the dielectric layer above the buried conductive layers. For example, a first RIE process may be used to punch through a portion of the conductive layers that act as the work function gate electrodes. During this etching process, the top corners of the exposed conductive layers may also be removed. However, this corner removal of conductive layers 116a and 116b is not a concern as any damage would only be caused to the dummy structure formed from the cap layer. A second RIE process may be used to punch through a portion of the gate dielectric. In some embodiments, the same RIE process is used to etch through the gate dielectric and form the via openings through the dielectric layer. In some other embodiments, a different RIE process is used to etch through the dielectric layer than the one used to punch through the gate dielectric. According to some embodiments, the etching process is complete once the underlying buried conductive layers are exposed by the etching process.

Method 400 continues with operation 412 where conductive material is formed over the semiconductor material and in the via opening to form conductive vias. The semiconductor material may be in the shape of a fin or of nanowires. According to some embodiments, the same deposited conductive material is present on both the first conductive layer and the second conductive layer. The conductive material may include a metal such as tungsten (W) or a combination of titanium nitride (TiN) and tungsten (W), to name a few examples.

Depositing the conductive material around the conductive layers also causes the conductive material to enter into the via openings and form the conductive vias that contact the buried conductive layers. According to some embodiments the conductive material seamlessly transitions between contacting the conductive layers and the buried conductive layers to electrically tie the gate electrodes of the corresponding semiconductor devices to buried power rails.

Example System

Figure 5:
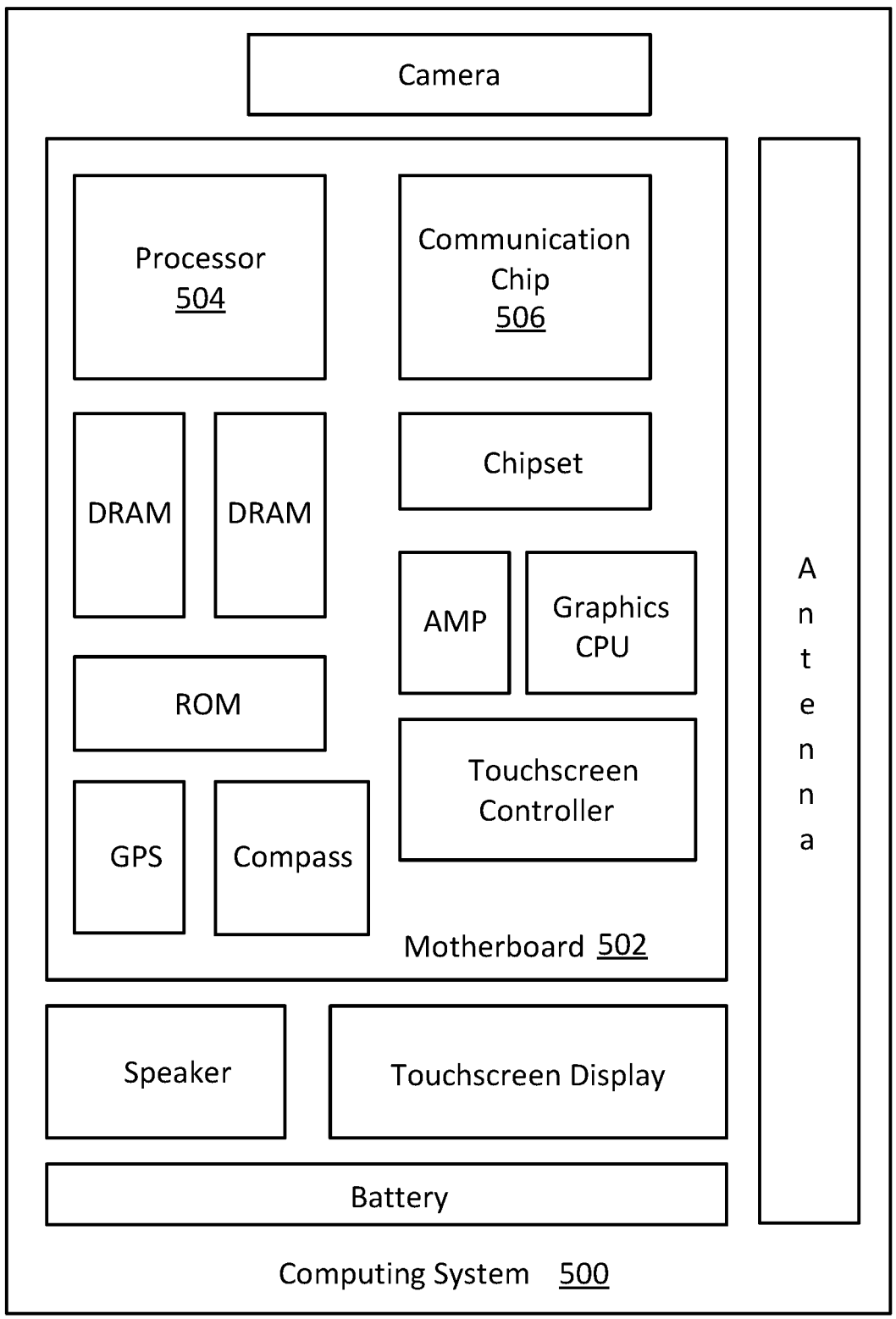
FIG. 5 illustrates a computing system including one or more integrated circuits, as variously described herein, in accordance with an embodiment of the present disclosure.

FIG. 5 is an example computing system implemented with one or more of the integrated circuit structures as disclosed herein, in accordance with some embodiments of the present disclosure. As can be seen, the computing system 500 houses a motherboard 502. The motherboard 502 may include a number of components, including, but not limited to, a processor 504 and at least one communication chip 506, each of which can be physically and electrically coupled to the motherboard 502, or otherwise integrated therein. As will be appreciated, the motherboard 502 may be, for example, any printed circuit board (PCB), whether a main board, a daughterboard mounted on a main board, or the only board of system 500, etc.

Depending on its applications, computing system 500 may include one or more other components that may or may not be physically and electrically coupled to the motherboard 502. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 500 may include one or more integrated circuit structures or devices configured in accordance with an example embodiment (e.g., a module including an integrated circuit on a substrate, the substrate having semiconductor devices with their gates tied to buried power rails through conductive vias, as variously provided herein). In some embodiments, multiple functions can be integrated into one or more chips (e.g., for instance, note that the communication chip 506 can be part of or otherwise integrated into the processor 504).

The communication chip 506 enables wireless communications for the transfer of data to and from the computing system 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing system 500 includes an integrated circuit die packaged within the processor 504. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 506 also may include an integrated circuit die packaged within the communication chip 506. In accordance with some such example embodiments, the integrated circuit die of the communication chip includes one or more semiconductor devices as variously described herein. As will be appreciated in light of this disclosure, note that multi-standard wireless capability may be integrated directly into the processor 504 (e.g., where functionality of any chips 506 is integrated into processor 504, rather than having separate communication chips). Further note that processor 504 may be a chip set having such wireless capability. In short, any number of processor 504 and/or communication chips 506 can be used. Likewise, any one chip or chip set can have multiple functions integrated therein.

In various implementations, the computing system 500 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 500 may be combined or integrated in a system-on-a-chip (SoC) architecture. In some embodiments, the components may be hardware components, firmware components, software components or any suitable combination of hardware, firmware or software.

FURTHER EXAMPLE EMBODIMENTS

The following examples pertain to further embodiments, from which numerous permutations and configurations will be apparent.

Example 1 is an integrated circuit that includes a substrate, a dielectric layer, a semiconductor device having at least a portion extending above a top surface of the dielectric layer and having a semiconductor material extending between a source region and a drain region, a conductive layer below the top surface of the dielectric layer within or below the substrate, a conductive material around the semiconductor material, and a via opening through the dielectric layer such that the conductive material is in the via opening and contacts the conductive layer.

Example 2 includes the subject matter of Example 1, wherein the conductive material comprises tungsten.

Example 3 includes the subject matter of Example 1 or 2, wherein the conductive material is a first conductive material and the integrated circuit further comprises a second conductive material around the semiconductor material such that the first conductive material is over the second conductive material.

Example 4 includes the subject matter of any one of Examples 1-3, wherein the semiconductor material comprises a plurality of semiconductor nanoribbons.

Example 5 includes the subject matter of Example 4, wherein the plurality of semiconductor nanoribbons comprise germanium, silicon, or a combination thereof.

Example 6 includes the subject matter of any one of Examples 1-5, wherein the integrated circuit comprises a dielectric wall adjacent to the semiconductor device and above the dielectric layer, wherein the via opening is aligned adjacent to a sidewall of the dielectric wall.

Example 7 includes the subject matter of Example 6, wherein the dielectric layer comprises silicon and oxygen, and the dielectric wall comprises silicon and nitrogen.

Example 8 includes the subject matter of any one of Examples 1-7, further comprising a gate structure on the semiconductor material, the gate structure including a gate electrode and a gate dielectric between the semiconductor material and the gate electrode, wherein the gate electrode includes the conductive material, such that the conductive material of the gate electrode and the conductive material in the via opening are a continuous body of conductive material.

Example 9 includes the subject matter of any one of Examples 1-8, wherein the semiconductor device comprises a subregion beneath the semiconductor material, wherein the subregion is surrounded by the dielectric layer.

Example 10 is a printed circuit board comprising the integrated circuit of any one of Examples 1-9.

Example 11 is an electronic device that includes a chip package comprising one or more dies. At least one of the one or more dies includes a dielectric layer, a semiconductor device extending above a top surface of the dielectric layer and having a semiconductor material extending between a source region and a drain region, a conductive layer below the top surface of the dielectric layer, a conductive material around the semiconductor material, and a via opening through the dielectric layer such that the conductive material is in the via opening and contacts the conductive layer.

Example 12 includes the subject matter of Example 11, wherein the conductive material comprises tungsten.

Example 13 includes the subject matter of Example 11 or 12, wherein the conductive material is a first conductive material and the at least one of the one or more dies further comprises a second conductive material around the semiconductor material such that the first conductive material is over the second conductive material.

Example 14 includes the subject matter of any one of Examples 11-13, wherein the semiconductor material comprises a plurality of semiconductor nanoribbons.

Example 15 includes the subject matter of Example 14, wherein the plurality of semiconductor nanoribbons comprise germanium, silicon, or a combination thereof.

Example 16 includes the subject matter of any one of Examples 11-15, wherein the at least one of the one or more dies further comprises a dielectric wall adjacent to the semiconductor device and above the dielectric layer, wherein the via opening is aligned adjacent to a sidewall of the dielectric wall.

Example 17 includes the subject matter of Example 16, wherein the dielectric layer comprises silicon and oxygen, and the dielectric wall comprises silicon and nitrogen.

Example 18 includes the subject matter of any one of Examples 11-17, further comprising a gate structure on the semiconductor material, the gate structure including a gate electrode and a gate dielectric between the semiconductor material and the gate electrode, wherein the gate electrode includes the conductive material, such that the conductive material of the gate electrode and the conductive material in the via opening are a continuous body of conductive material.

Example 19 includes the subject matter of any one of Examples 11-18, wherein the semiconductor device comprises a subregion beneath the semiconductor material, wherein the subregion is surrounded by the dielectric layer.

Example 20 is a method of forming an integrated circuit. The method includes forming a fin structure extending above a substrate, the fin structure comprising semiconductor material; forming a conductive layer adjacent to the fin structure and within the substrate, or below the substrate; forming a dielectric layer above the conductive layer, at least a portion of the fin structure extending above a top surface of the dielectric layer; forming a via opening through the dielectric layer to expose the conductive layer, the via opening being adjacent to the fin structure; and forming a conductive material around the semiconductor material and in the via opening, such that the conductive material contacts the conductive layer.

Example 21 includes the subject matter of Example 20, wherein forming the via opening comprises removing a portion of the dielectric cap layer.

Example 22 includes the subject matter of Example 20 or 21, wherein the conductive material is a second conductive material and the method further comprises forming a first conductive material around the semiconductor material, such that the second conductive material is over the first conductive material.

Example 23 includes the subject matter of Example 22, wherein forming the via opening further comprises removing a portion of the first conductive material above a location of the via opening.

Example 24 includes the subject matter of any one of Examples 20-23, wherein the fin structure is a multilayer structure having layers of the semiconductor material and the method further comprises forming a plurality of semiconductor nanoribbons from the layers of the semiconductor material.

Example 25 includes the subject matter of any one of Examples 20-24, further comprising completely removing the dielectric cap layer after forming the conductive material.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
   a substrate;
   a dielectric layer;
   a semiconductor device having at least a portion extending above a top surface of the dielectric layer and having a semiconductor material extending between a source region and a drain region;
   a conductive layer below the top surface of the dielectric layer within or below the substrate, wherein a top surface of the conductive layer directly contacts a bottom surface of the dielectric layer;
   a conductive material around the semiconductor material; and
   a via opening through the dielectric layer, such that the conductive material is in the via opening and contacts the conductive layer.

2. The integrated circuit of claim 1, wherein the conductive material is a first conductive material and the integrated circuit further comprises a second conductive material around the semiconductor material such that the first conductive material is over the second conductive material.

3. The integrated circuit of claim 1, wherein the semiconductor material comprises a plurality of semiconductor nanoribbons.

4. The integrated circuit of claim 1, wherein the integrated circuit comprises a dielectric wall adjacent to the semiconductor device and above the dielectric layer, wherein the via opening is aligned adjacent to a sidewall of the dielectric wall.

5. The integrated circuit of claim 4, wherein the dielectric layer comprises silicon and oxygen, and the dielectric wall comprises silicon and nitrogen.

6. The integrated circuit of claim 1, further comprising: a gate structure on the semiconductor material, the gate structure including a gate electrode and a gate dielectric between the semiconductor material and the gate electrode, wherein the gate electrode includes the conductive material, such that the conductive material of the gate electrode and the conductive material in the via opening are a continuous body of conductive material.

7. The integrated circuit of claim 1, wherein the semiconductor device comprises a subregion beneath the semiconductor material, wherein the subregion is surrounded by the dielectric layer.

8. A printed circuit board comprising the integrated circuit of claim 1.

9. An electronic device, comprising:
a chip package comprising one or more dies, at least one of the one or more dies comprising a dielectric layer;
a semiconductor device extending above a top surface of the dielectric layer and having a semiconductor material extending between a source region and a drain region;
a conductive layer below the top surface of the dielectric layer, wherein a top surface of the conductive layer directly contacts a bottom surface of the dielectric layer;
a conductive material around the semiconductor material; and
a via opening through the dielectric layer, such that the conductive material is in the via opening and contacts the conductive layer.

10. The electronic device of claim 9, wherein the conductive material is a first conductive material and the at least one of the one or more dies further comprises a second conductive material around the semiconductor material such that the first conductive material is over the second conductive material.

11. The electronic device of claim 9, wherein the semiconductor material comprises a plurality of semiconductor nanoribbons.

12. The electronic device of claim 9, wherein the at least one of the one or more dies further comprises a dielectric wall adjacent to the semiconductor device and above the dielectric layer, wherein the via opening is aligned adjacent to a sidewall of the dielectric wall.

13. The electronic device of claim 12, wherein the dielectric layer comprises silicon and oxygen, and the dielectric wall comprises silicon and nitrogen.

14. The electronic device of claim 9, further comprising: a gate structure on the semiconductor material, the gate structure including a gate electrode and a gate dielectric between the semiconductor material and the gate electrode, wherein the gate electrode includes a first portion of the conductive material and the via opening includes a second portion of the conductive material, and wherein the first and second portions of conductive material are a continuous body of the conductive material, the conductive material being a metal or an alloy.

15. The electronic device of claim 9, wherein the semiconductor device comprises a subregion beneath the semiconductor material, wherein the subregion is surrounded by the dielectric layer.

16. An integrated circuit comprising:
a semiconductor device having a semiconductor material extending along a first direction between a first source or drain region and a second source or drain region, and a gate structure extending in a second direction over the semiconductor material;
a dielectric layer beneath the gate structure; and
a conductive layer below a bottom surface of the dielectric layer, wherein a top surface of the conductive layer directly contacts a bottom surface of the dielectric layer, and
wherein a portion of the gate structure extends in a third direction through an entire thickness of the dielectric layer and contacts the top surface of the conductive layer.

17. The integrated circuit of claim 16, wherein the gate structure comprises a first conductive material and a second conductive material, such that the first conductive material is over the second conductive material.

18. The integrated circuit of claim 16, wherein the semiconductor material comprises a plurality of semiconductor nanoribbons.

19. The integrated circuit of claim 16, further comprising a dielectric wall adjacent to the semiconductor device and above the dielectric layer.

20. The integrated circuit of claim 16, wherein the semiconductor device comprises a subfin beneath the semiconductor material, wherein the subfin is directly adjacent to the dielectric layer along the second direction.

* * * * *